United States Patent
Ushiyama et al.

(10) Patent No.: US 7,410,905 B2
(45) Date of Patent: Aug. 12, 2008

(54) METHOD FOR FABRICATING THIN FILM PATTERN, DEVICE AND FABRICATING METHOD THEREFOR, METHOD FOR FABRICATING LIQUID CRYSTAL DISPLAY, LIQUID CRYSTAL DISPLAY, METHOD FOR FABRICATING ACTIVE MATRIX SUBSTRATE, ELECTRO-OPTICAL APPARATUS, AND ELECTRICAL APPARATUS

(75) Inventors: Toshihiro Ushiyama, Chimo (JP); Toshimitsu Hirai, Chino (JP); Toshiaki Mikoshiba, Suwa (JP); Hiroshi Kiguchi, Suwa (JP); Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 134 days.

(21) Appl. No.: 10/854,668

(22) Filed: May 27, 2004

(65) Prior Publication Data
US 2005/0003640 A1 Jan. 6, 2005

(30) Foreign Application Priority Data

| May 30, 2003 | (JP) | ............................ 2003-155858 |
| May 30, 2003 | (JP) | ............................ 2003-155865 |
| May 30, 2003 | (JP) | ............................ 2003-155866 |
| May 30, 2003 | (JP) | ............................ 2003-155867 |
| Mar. 31, 2004 | (JP) | ............................ 2004-103418 |

(51) Int. Cl.
*H01L 21/30* (2006.01)
*B05D 7/00* (2006.01)
*B41J 2/01* (2006.01)

(52) U.S. Cl. ...................... 438/701; 438/702; 427/466; 257/E21.535; 347/107

(58) Field of Classification Search ......... 427/466–469; 438/500, 502, 978, 694, 700–702; 347/101, 347/103, 105, 107; 216/18, 27, 39; 257/E21.535
See application file for complete search history.

(56) References Cited

U.S. PATENT DOCUMENTS

| 5,132,248 | A | | 7/1992 | Drummond et al. |
| 5,284,287 | A | * | 2/1994 | Wilson et al. .......... 228/180.22 |
| 5,492,266 | A | * | 2/1996 | Hoebener et al. ........ 228/248.1 |
| 6,089,151 | A | * | 7/2000 | Cobbley et al. ............. 101/127 |
| 6,184,946 | B1 | | 2/2001 | Ando et al. |
| 6,245,469 | B1 | * | 6/2001 | Shiba et al. ..................... 430/7 |
| 6,372,154 | B1 | * | 4/2002 | Li .......................... 252/301.16 |
| 6,517,894 | B1 | | 2/2003 | Hongo et al. |
| 6,592,943 | B2 | * | 7/2003 | Chan et al. ................... 427/282 |
| 6,838,361 | B2 | * | 1/2005 | Takeo ......................... 438/493 |
| 2002/0145807 | A1 | * | 10/2002 | Nishikawa ................... 359/619 |
| 2003/0059984 | A1 | * | 3/2003 | Sirringhaus et al. ......... 438/141 |
| 2003/0108804 | A1 | * | 6/2003 | Cheng et al. ..................... 430/7 |
| 2003/0193624 | A1 | * | 10/2003 | Kobayashi et al. ............ 349/42 |
| 2003/0230747 | A1 | * | 12/2003 | Ostergard ..................... 257/40 |

(Continued)

FOREIGN PATENT DOCUMENTS

CN 1154490 A 7/1997

(Continued)

*Primary Examiner*—Bradley W. Baumeister
*Assistant Examiner*—Matthew W Such
(74) *Attorney, Agent, or Firm*—Oliff & Berridge, PLC

(57) ABSTRACT

A method for fabricating a thin film pattern on a substrate, includes the steps of: forming a concave part on the substrate that conforms to the thin film pattern; and applying a function liquid into the concave part.

8 Claims, 27 Drawing Sheets

U.S. PATENT DOCUMENTS

| | | | |
|---|---|---|---|
| 2004/0005770 A1* | 1/2004 | Farnworth et al. | 438/612 |
| 2004/0029382 A1* | 2/2004 | Kwase | 438/689 |
| 2004/0248338 A1* | 12/2004 | Sirringhaus et al. | 438/99 |
| 2005/0071969 A1* | 4/2005 | Sirringhaus et al. | 29/4.51 |
| 2005/0136358 A1* | 6/2005 | Paul et al. | 430/311 |
| 2005/0173695 A1* | 8/2005 | Song et al. | 257/14 |
| 2005/0179365 A1* | 8/2005 | Deane et al. | 313/500 |
| 2005/0196969 A1* | 9/2005 | Gunner et al. | 438/725 |
| 2006/0014001 A1* | 1/2006 | Zhang et al. | 428/195.1 |
| 2006/0148167 A1* | 7/2006 | Brown et al. | 438/232 |
| 2006/0160276 A1* | 7/2006 | Brown et al. | 438/149 |

FOREIGN PATENT DOCUMENTS

| | | |
|---|---|---|
| EP | 0 989 778 | 3/2000 |
| JP | A-9-36520 | 2/1997 |
| JP | A-9-219577 | 8/1997 |
| JP | A-10-186412 | 7/1998 |
| JP | A-2000-187111 | 7/2000 |
| JP | A-2000-202357 | 7/2000 |
| JP | A-2001-276726 | 10/2001 |
| JP | A-2001-291583 | 10/2001 |
| JP | A 2002-164635 | 6/2002 |
| JP | B2-3332134 | 7/2002 |
| JP | A-2003-80694 | 3/2003 |
| JP | B2 3427664 | 5/2003 |
| KR | 2001-0034825 | 4/2001 |
| WO | WO 98/23995 | 6/1998 |
| WO | WO 99/48339 | 9/1999 |
| WO | WO 2004083843 A1 * | 9/2004 |

* cited by examiner

METHOD FOR FABRICATING THIN FILM PATTERN, DEVICE AND FABRICATING METHOD THEREFOR, METHOD FOR FABRICATING LIQUID CRYSTAL DISPLAY, LIQUID CRYSTAL DISPLAY, METHOD FOR FABRICATING ACTIVE MATRIX SUBSTRATE, ELECTRO-OPTICAL APPARATUS, AND ELECTRICAL APPARATUS

BACKGROUND OF THE INVENTION

1. Field of the Invention

The present invention relates to a method for fabricating a thin film pattern, a device and fabricating method therefor, a method for fabricating a liquid crystal display, a liquid crystal display, a method for fabricating an active matrix substrate, an electro-optical apparatus, and an electrical apparatus.

Priority is claimed on Japanese Patent Application No. 2003-155858, filed May, 2003, Japanese Patent Application No. 2003-155865, filed May, 2003, Japanese Patent Application No. 2003-155866, filed May, 2003, Japanese Patent Application No. 2003-155867, filed May, 2003, Japanese Patent Application No. 2004-103418, filed March, 2004, the contents of which are incorporated herein by reference.

2. Description of Related Art

To fabricate a device having wiring used for electronic circuits or integrated circuits, a photolithographic method, for example, is used. This photolithographic method forms a wiring pattern on a thin film by applying a photosensitive material called a resist to a substrate that has had a conducting film applied thereto in advance, the circuit pattern is developed by being irradiated, and the conducting film is etched that conforms to the resist pattern. This photolithographic method requires large-scale equipment and complicated steps. In addition, the material use efficiency is only a few percent, most of the product must be discarded, and thus the fabrication cost is high.

In contrast, U.S. Pat. No. 5,132,248 proposes a method wherein a wiring pattern is formed on a substrate by using an ink ejection method in which a liquid material is ejected in a droplet form from a liquid discharge head, also known as an inkjet method. In this method, a wiring pattern ink, which is a function liquid having conductive particles such as gold particles dispersed therein, is applied directly to a substrate, and subsequently this ink is converted to a thin film conducting film pattern by heat treatment and laser irradiation. According to this method, there are the merits that photolithography becomes unnecessary, the process can be greatly simplified, and the amount of raw materials used becomes small.

At the same time, with the popularization of mobile devices such as mobile telephones, thin and light liquid crystal displays have become widely used. This type of liquid crystal display has a liquid crystal interposed between an upper substrate and a lower substrate.

An example of the lower substrate is shown in FIG. 48. As shown in this figure, the lower substrate 1 is formed by providing a glass substrate 2, a gate scanning line electrode and a source electrode 4 that are laid out so as to intersect each other on this glass substrate 1, a drain electrode 5 similarly laid out on the glass substrate 2, an image electrode (ITO) 6 connected to this drain electrode 5, an insulating layer 7 interposed between the gate scanning line electrode 3 and the source electrode 4, and a TFT (thin film transistor) consisting of a thin film semiconductor.

In the formation of each of the metal wires on the substrate 1, conventionally a method in which, for example, a dry process and photoetching are combined is used, but the dry process has the drawbacks that the fabrication cost is high and adapting it to increasingly larger substrate sizes is difficult. Thus, a method in which the metal wiring is formed on the glass substrate by using an inkjet method is being used (refer, for example, to Japanese Unexamined Patent Application, First Publication No. 2002-164635).

However, the conventional technology described above has the following problems.

Because the wiring patterns are formed by conductive particles applied to the surface of the substrate, the films that consist of the conductive particles protrude from the substrate surface, and this is a cause of obstructing the thin formation of the device.

In addition, there is a concern this may hinder the increasing integration even for devices having a wiring pattern formed over several layers on the substrate.

In addition, in other methods as well, as shown in FIG. 48, many irregularities remain on the surface of the completed product. If these irregularities become comparatively large, there is a concern that display distortions will occur when the liquid crystal display is assembled.

Specifically, a rubbing treatment will be carried out on the upper surface of this lower substrate 1 after formation of the orientation film. However, there is a concern that differences will occur in the results of the rubbing at the concave and convex parts. When such unevenness in the rubbing treatment occurs, differences in the orientation force of the liquid crystal will occur between parts thereof, and display distortions occur as a result.

In consideration of the problems described above, objects of the present invention are to provide method for fabricating a thin film pattern that can realize increased thinness, a device and fabricating method for the same, an electro-optical apparatus, and electrical apparatus.

SUMMARY OF THE INVENTION

In order to achieve the objects described above, the present invention provides a method for fabricating a thin film pattern on a substrate, including the steps of: forming a concave part on the substrate that conforms to the thin film pattern; and applying a function liquid into the concave part. The method may further include the steps of: building up banks on the substrate that conform to the thin film pattern; forming the concave part on the substrate between the banks; and removing the banks after applying the function liquid.

Therefore, in the present invention, because the thin film pattern can be formed in the concave part of the substrate, it becomes possible to carry out wiring without the wires projecting from the substrate surface, and devices that use this substrate can be made thinner. At the same time, it becomes possible to increase the integration when laminating the wiring pattern (thin film pattern). In addition, after building up the banks, when the function liquid is ejected (applied) to the concave part formed on the substrate between the banks, the drops of the function liquid do not readily spatter over the surroundings, and it becomes possible to carry out patterning in a predetermined profile. In addition, it is possible to prevent thickening of the substrate if the banks are removed after the function liquid has been applied.

Note that when banks have been built up, preferably a concave part is formed by etching, for example, using the banks as a mask.

Thereby, it becomes possible to fabricate a separate mask, the work of setting the mask on the substrate becomes unnecessary, and the productivity can be improved.

In addition, when the banks have been built up, preferably a step in which the banks have imparted a liquid repellency that is stronger than that of the concave part.

Thereby, even if a part of the ejected droplet falls on a bank, the droplet is repelled from the bank because the bank surface has been made liquid repelling, and it flows down into the concave part between banks. Therefore, the ejected function liquid spreads in the concave part on the substrate and can fill the concave part more evenly.

Note that when conductive particles are included in the function liquid, the thin film pattern can be used as the wiring pattern, and application to any type of device becomes possible. In addition, besides conductive particles, by using a phosphorescent element formation material such as an organic EL or an RGB ink material, application to fabrication, for example, of liquid crystal displays having color filters becomes possible. Furthermore, it is possible to select a function liquid that exhibits conductivity due to heat processing such as heating or due to light processing such as light irradiation.

The present invention provides a method for fabricating a device having a substrate, including a step of forming a thin film pattern on the substrate using the above-mentioned method for fabricating a thin film pattern.

Thereby, in the present invention, it is possible to obtain a device that is thin and can be highly integrated.

In particular, it is possible to obtain a highly integrated thin switching element when forming a part of a switching element such as a TFT (thin film transistor) having a thin film pattern formed on the substrate.

In addition, the present invention provides an electro-optical apparatus including a device that is manufactured by using the device fabricating method described above.

In addition, the present invention provides an electrical apparatus including the electro-optical apparatus described above.

Thereby, in the present invention, it becomes possible to obtain a thin film electro-optical apparatus and electrical apparatus.

In addition, the present invention provides a device including: a substrate; a concave part formed on the substrate; and a thin film pattern disposed in the concave part, wherein the concave part is formed so as to conform to the thin film pattern.

Thereby, in the present invention, because the thin film pattern can be formed in the concave part of the substrate, it becomes possible to carry out wiring without the wires protruding from the substrate surface, and devices that use this substrate can be made thinner. At the same time, it becomes possible to increase the integration when laminating the wiring pattern (thin film pattern).

Preferably, the thin film pattern is formed so as not to protrude from the surface of the substrate.

Thereby, in the present invention, decreasing the thinness becomes possible, and at the same time, in addition to being able to decrease the thinness, the surface flatness is improved when the surface of the thin film pattern and the substrate surface are made flush, and post-processing such as forming an insulating film become easy.

In addition, preferably, the concave part is formed having a reverse taper whose cross-section gradually widens towards a bottom thereof.

Thereby, in the present invention, the thin film pattern formed in the concave part becomes difficult to strip from the substrate, and it becomes possible to prevent deterioration in the quality of the device.

Note that when the thin film pattern is formed by a conducting film, the thin film pattern can serve as the wiring pattern, and application to any type of device becomes possible.

In addition, the present invention provides a method for fabricating a liquid crystal display, including: a substrate groove formation step of forming a substrate groove on a substrate; a liquid repellent part formation step of forming a liquid repellent part so as to define the substrate groove; a first conduction pattern formation step of forming a first conductive pattern by ejecting droplets that include a conducting material into the substrate groove; a first insulating layer formation step of forming a first insulating layer so as to cover at least the first conductive pattern; a bank formation step of forming first banks that provide a thin film transistor comprising a thin film semiconductor and transparent first banks on the first insulating layer; a second conductive pattern formation step forming a second conductive pattern by ejecting droplets that include a conducting material into the formation region defined by the banks; and a second insulating layer formation step of forming a second insulating layer so as to cover at least the first banks and the second conductive pattern.

According to the fabricating method for this liquid crystal display, the substrate before the first insulation film formation step is formed such that the first conductive pattern is embedded in the substrate groove, and thus has a flat surface profile. Because a first insulating layer is formed on a flat substrate, it is possible to form a flat first insulating layer by the first insulating layer formation step. Furthermore, in the second conductive pattern formation step, one flat layer is formed on this flat first insulating layer in which the first banks and the second conductive pattern are integrally formed.

In the second insulating layer formation step, the second insulating layer is formed on this flat layer, and thus it is possible to form a flat second insulating layer. Specifically, the first banks that would usually have been removed are left in place to form the second insulating layer, and thus a surface profile having less irregularity than a conventional one can be guaranteed.

As explained above, it is possible to guarantee that after completion of all steps, the substrate will have a flat surface profile. Thereby, when carrying out a rubbing treatment on the substrate, irregularities in the result occur with difficulty, and thus it becomes possible to prevent display distortions by improving the liquid crystal orientation force.

In addition, the first conductive pattern formed by the first conductive pattern formation step is formed so as to be embedded in the substrate groove, and thus, in comparison to the case in which the first conductive pattern formed on a substrate without a substrate groove, the thickness dimension of the substrate after completion can be made thin.

Furthermore, in the fabricating method of the liquid crystal display described above, in the liquid repelling part formation step, the liquid repelling part can be formed by forming second banks that define the substrate groove, and the second banks can be removed before the first insulating layer formation step.

In this case, by forming the second banks, it is possible to form reliably a fine first conduction pattern by the first conductive pattern formation step described above. In addition, because the second banks are removed after the first conductive pattern formation step, the substrate after completion can be made thin.

In addition, in order to solve the problems described above, the present invention provides a liquid crystal display including: two substrates, one of which includes substrate grooves formed thereon and a first conductive pattern formed in the substrate grooves; a liquid crystal layer interposed between the substrates; an insulating layer that is formed so as to cover at least the first conductive pattern; a thin film transistor comprising a thin film semiconductor and disposed on the insulating layer; transparent banks disposed on the insulating layer; and a second conductive pattern defined by the transparent banks and disposed on the insulating layer.

According to this liquid crystal display, because one substrate is formed so that the first conductive pattern is embedded in the substrate grooves, it has a flat surface. Thus, it is possible to impart a flat surface to the insulating layer formed on this flat surface as well. Furthermore, it is possible to impart a flat surface to the thin film transistors, banks, and second conductive pattern formed on this flat insulating layer. Specifically, a surface profile having fewer irregularities than a conventional one can be guaranteed because the banks that would usually have been removed are left in place.

In this manner, because each surface is flat, the liquid crystal alignment resistance force increases because irregularities in the rubbing treatment are prevented. Therefore, the liquid crystal display can prevent display distortions.

In addition, the first conductive pattern formed by the first conductive pattern formation step is formed so as to be embedded in the substrate groove, and thus, in comparison to the case in which the first conductive pattern formed on a substrate without a substrate groove, the thickness dimension of the substrate after completion can be made thin.

Furthermore, to solve the problems described above, the present invention provides a method for fabricating a liquid crystal display, including: a substrate groove formation step of forming a substrate groove in a substrate; a first bank formation step of forming first banks within the substrate groove; and a first conductive pattern formation step of forming a first conductive pattern in the substrate groove by ejecting droplets that include a conducting material into a region defined by the first banks.

According to this fabricating method for a liquid crystal display, because the wiring formation is carried out by filling the concave substrate groove with the first banks and the first conductive pattern, it is possible to guarantee a flat surface having fewer irregularities that a conventional one. Thereby, when carrying out a rubbing treatment on the substrate, irregularities in the result occur with difficulty, and thus it becomes possible to prevent display distortions by improving the liquid crystal orientation force.

In addition, by embedding the first banks and the first conductive pattern in the substrate groove, it becomes possible to make the thickness dimension of the substrate after completion thin in comparison to the case of forming the first conductive pattern without providing the substrate groove.

Furthermore, the method for fabricating a liquid crystal display described above may further include a first insulating layer formation step of covering at least the first conductive pattern and the first banks by an insulating layer; a second bank formation step of forming a thin film transistor comprising a thin film semiconductor and second banks in the substrate groove; and a second conductive pattern formation step of forming a second conductive pattern in the substrate groove by ejecting droplets that include a conducting material into a region defined by the second banks.

In this case, because an insulating layer, a thin film transistor, second banks, and a second conductive pattern region also accommodated in the substrate groove, it is possible to guarantee an even more flat surface profile. Thereby, it is possible to increase further the evenness of the rubbing treatment even more, and it becomes possible to prevent display irregularity by increasing the liquid crystal alignment resistance force. In addition, it is possible to make the thickness dimension of the substrate after completion even thinner.

In addition, in order to solve the problems described above, the present invention provides a liquid crystal display including: two substrates, one of which includes substrate grooves formed thereon; a liquid crystal layer interposed between the substrates; and at least one layer comprising banks and conductive pattern formed in a region defined by the banks is provided in the substrate groove.

According to this liquid crystal display, because wiring formation is carried out in the substrate groove such that the banks and the conductive pattern are embedded in the substrate groove, it is possible to guarantee a flat surface profile having fewer irregularities than a conventional one. Due to such increased flatness, the liquid crystal alignment resistance force is increased by preventing irregularities in the rubbing treatment. Therefore, the liquid crystal display can prevent display distortions.

In addition, because the banks and conductive pattern are embedded in the substrate groove so as to form wirings, it is possible to make the thickness dimension of the substrate thin in comparison to a conventional one in which the conductive pattern is formed on a substrate surface that does not have substrate grooves.

In order to solve the problems described above, the present invention provides a method for fabricating a liquid crystal display, including: a bank formation step of forming transparent banks on an upper surface of a substrate; a conductive pattern formation step of forming a first conductive pattern by ejecting droplets that include a conducting material into a formation region defined by the banks; and an insulating layer formation step of forming a thin film transistor comprising a thin film semiconductor and an insulating layer so as to cover at least the banks and the first conductive pattern.

According to the fabricating method of this liquid crystal display, the substrate before the insulating layer formation step forms one flat layer in which the banks and first conductive pattern are integrally formed. By forming the insulating layer on this flat layer, it is possible to form a flat insulating layer.

In this manner, because the insulating layer is formed by leaving in place the banks that would be usually be removed, it is possible to guarantee a surface profile that has fewer irregularities than a conventional one. Thereby, when carrying out the rubbing treatment, because irregularities in the result occur with difficulty, it is possible to prevent display distortions by increasing the liquid crystal alignment resistance force Furthermore, in the fabricating method for the liquid crystal display described above, it is possible to carry out a bank formation step, a conductive pattern formation step, and an insulating layer formation step on the insulating layer, and form a second conductive pattern that intersects the first conductive pattern.

In this case as well, the substrate before repeating the insulating layer formation step forms one flat surface on which the banks and second conductive pattern formed by the repeated conductive pattern formation step are integrally formed. By forming the insulating layer again on this flat surface, it is possible to form a flat insulating layer.

Therefore, in the case, for example, that, in a planar view, the traversing gate scanning line electrode, the capacity line, the source electrode, and the drain electrode are formed by the conductive pattern, an insulating layer is formed in which the banks for forming these electrodes remains in place, and thus it is possible to guarantee a surface profile that has fewer irregularities that a conventional one, and it becomes possible to increase the liquid crystal alignment resistance force by making the result of the rubbing treatment uniform.

Furthermore, in the fabricating method for the liquid crystal display described above, the gate scanning line electrode, the source electrode, the drain electrode, and the pixel electrode can be formed by a metal wiring formation step that includes the conductive pattern formation step.

In this case, because the gate wiring, the source wiring, the drain wiring, and the pixel electrode are formed by the ejection of a droplet that includes a conducting material, it is possible to reduce material used in the metal wiring formation step.

In addition, in order to solve the problems described above, the present invention provides a liquid crystal display including: two substrates; a liquid crystal layer interposed between the substrates; a first conductive layer comprising transparent first banks provided on one of the substrates, and a first conductive pattern provided in a region defined by the first banks; and a first insulating layer provided on the first conductive layer.

According to this liquid crystal display, one flat first conductive layer is formed in the one substrate in which the banks and first conductive pattern are integrally formed. Therefore, it is also possible to impart a flat surface profile to the first insulating layer formed on this flat first conductive layer.

In this manner, because the first insulating layer is formed with the banks that would usually be removed remaining in place, it is possible to guarantee a surface profile having fewer irregularities that a conventional one. Due to this flatness, because the liquid crystal alignment resistance force is increased because irregularities in the rubbing treatment are prevented, the liquid crystal display can prevent display distortions.

Furthermore, in the liquid crystal display described above, it is possible to provide a second conductive layer consisting of second banks provided on the first insulating layer and a second conductive pattern, and a second insulating layer provided on the second conductive layer.

In this case, one flat second conductive layer is formed in which the second banks and the second conductive pattern are integrally formed. In addition, it is also possible to impart a flat surface profile to the second insulating layer provided on this flat second conductive layer.

Therefore, in the case, for example, that the traversing conductive pattern on this flat surface serves as the gate scanning line electrode and the source electrode, the banks for forming these electrodes remains in place, and thus it is possible to guarantee a surface profile having fewer irregularities than a conventional one, and it becomes possible to increase the liquid crystal alignment resistance force by making the result of the rubbing treatment uniform.

In addition, the present invention provides an electrical apparatus including a liquid crystal display fabricated by using the method for fabricating a liquid crystal display described above, or including the liquid crystal display described above.

According to this electronic device, because a liquid crystal display having a superior liquid crystal alignment resistance force is provided, it becomes possible to provide an electronic device providing a visually superior display unit that does not have display distortions.

In addition, the present invention provides a method for fabricating an active matrix substrate including: a first step of forming gate wiring on a substrate; a second step of forming a gate insulating layer on the gate wiring; a third step of laminating a semiconductor layer over the gate insulating layer; a fourth step of forming a source electrode and a drain electrode on the gate insulating layer; a fifth step of disposing an insulating material on the source electrode and the drain electrode; a sixth step of forming a pixel electrode that is electrically connected to the drain electrode, wherein at least one of the first step, the fourth step, and the sixth step comprises a step of forming a concave part that conforms to the formation pattern and a material disposition step of disposing a function liquid in the concave part by ejection using a droplet ejection device.

According to the present invention, it becomes possible to carry out wiring formation in which the gate wiring, the source electrode, the drain electrode, and the pixel electrode do not protrude from the substrate surface, the device using this substrate can be made thin, and it is possible to increase integration when laminating a wiring pattern (thin film pattern).

DETAILED DESCRIPTION OF THE INVENTION

Figure 1:
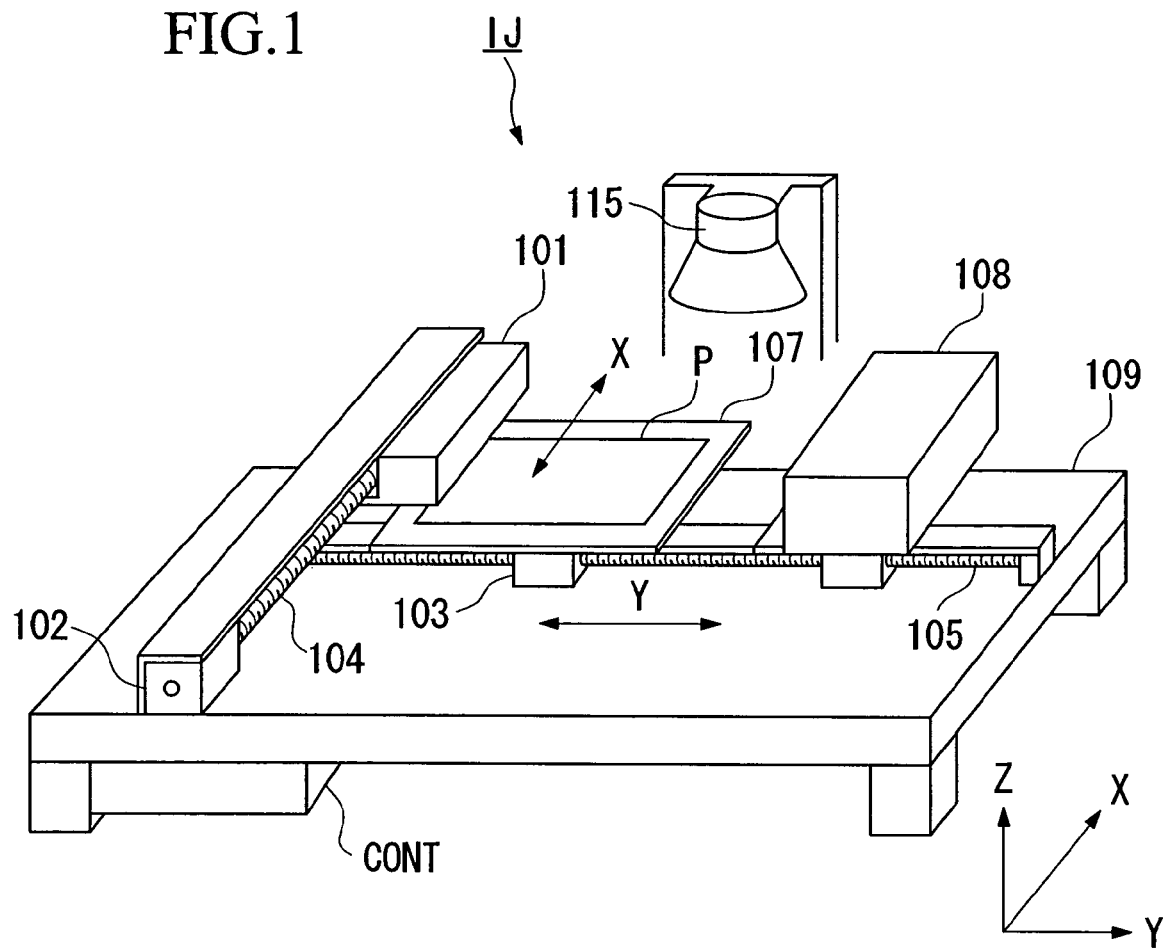
FIG. 1 is a schematic perspective drawing of the droplet ejecting device.

Below, embodiments of the thin film pattern fabricating method, a device and a fabricating method for the same, a fabricating method for a liquid crystal display, a liquid crystal display, a method for fabricating an active matrix substrate, an electro-optical apparatus, and an electronic device of the present invention are explained with reference to FIG. 1 through FIG. 48.

First Embodiment

In the present embodiment, an example is explained for the case in which a wiring pattern (thin film pattern) ink (function liquid) that includes conductive particles is ejected as a droplet from the nozzle of a droplet ejection head using a droplet ejection method, and a wiring pattern formed by the conducting film is formed on the substrate.

The wiring pattern ink consists of a dispersant that disperses conductive particles into a dispersing medium, organic silver compounds, and a solvent that disperses silver oxide nanoparticles in a medium (dispersion medium).

In the present embodiment, in addition to using metal particles including any one among, for example, gold, silver, copper, palladium, and nickel as the conductive particles, the oxides thereof, along with conducting polymers and superconductive particles can be used.

These conductive particles can be used after the surface has been coated with organic substances in order to improve the dispersibility.

The diameters of the conductive particles are preferably equal to or greater than 1 nm and equal to or less than 0.1 µm. When the diameter is larger than 0.1 µm, there is a concern that they will plug the nozzle of the liquid ejection head described below. In addition, when the diameter is smaller than 1 nm, the volume ratio of the coating material to the conductive particle becomes large, and the proportion of the organic material in the obtained film becomes excessive.

The dispersant is not particularly limited as long as the conductive particles described above can be dispersed and they do not flocculate.

For example, besides water, alcohols such as methanol, ethanol, propanol, butanol, or the like; hydrocarbon compounds such as n-heptane, n-octane, decane, dodecane, tetradecane, toluene, xylene, cymene, durene, indene, dipentene, tetrahydronaphthalene, decahydronaphthalene, cyclohexylbenzene; ether compounds such as ethylene glycol dimethylether, ethylene glycol diethylether, ethylene glycol methylethylether, diethylene glycol dimethylether, diethylene glycol diethylether, diethylene glycol methylethylether, 1,2-demetoxyethane, bis(2-metoxyethyl) ether, p-dioxane; and further, polar compounds such as propylene carbonate, γ-butyrolactone, N-methyl-2-pyrolidone, dimethylformamide, dimethylsulfoxide, cyclohexanone. Among these, in terms of the dispersibility of the particles, stability of the dispersion liquid, and ease of application to the droplet ejection method (ink jet method), water, alcohols, hydrocarbon compounds, and ether compounds are preferable, and as a dispersion medium, water and hydrocarbon compounds are more preferable.

The surface tension of the dispersing liquid for the conductive particles described above is preferably within a range equal to or greater than 0.02 N/m and equal to or less than 0.07 N/m. When ejecting the liquid in an ink jet method, when the surface tension is less than 0.02 N/m, the curvature of the ejection path occurs easily because wettability of the ink compound with respect to the nozzle surface increases. When the surface tension exceeds 0.07 N/m, the control of the amount of the ejection and the ejection timing becomes difficult because the contour of the meniscus at the distal end of the nozzle is unstable. In order to adjust the surface tension, in the dispersing liquid, fluoride, silicone, or nonionic surface tension modifier can be added in small amounts within a range in which the contact angle with the substrate does not decrease greatly. A nonionic surface tension modifier increases the wettability of the liquid with respect to the substrate, improves the leveling of the film, and contributes to preventing occurrences of fine irregularities in the film. As necessary, the surface tension modifier described above can also include organic compounds such as alcohol, ether, ester, ketone and the like.

The viscosity of the dispersing liquid is preferably equal to or greater than 1 mPa·s and equal to or less than 50 mPa·s. During the ejection of the liquid material as a droplet by using an ink jet method, when the viscosity is smaller than 1 mPa·s, the vicinity of the nozzle easily becomes contaminated due to flowing out of the ink, and when the viscosity is larger than 50 mPa·s, the frequency of clogging of the nozzle hole becomes high and flat ejection of the droplets becomes difficult.

Any type of glass, silicon glass, Si wafers, plastic films, metal plates, or the like can be used as the substrate on which the wiring pattern is formed. In addition, semiconductor films, metal films, dielectric films, organic films or the like can be formed as under layers on the surface of any type of these material substrates.

The electrification control method, the pressure oscillation method, the electromechanical conversion method, the electro-thermal conversion method, and the electrostatic attraction method can be used as ejection technology for the droplet ejection method. The electrification control method imparts an electric charge to the material by using an electrification electrode, and controls the trajectory of the material by using a deflecting electrode to eject the material from the nozzle. In addition, a pressure oscillation method ejects the material to the distal end of the nozzle by applying an ultrahigh pressure of about 30 kg/cm$^2$ to the material. When a control voltage is not applied, the material is propelled forward to be ejected from the nozzle, and when the control voltage is applied, the electrostatic reaction within the material occurs, the material is scattered and does not eject from the nozzle. In addition, the electromechanical conversion method uses the characteristic that a piezoelectric element deforms upon receiving a pulsed electrical signal. A pressure is applied to the space accommodating the material via a flexible substance due to the deformation of the piezoelectric element, the material is pushed out of this space, and is ejected from the nozzle.

Next, a device fabrication apparatus used when fabricating the device according to the present invention will be explained.

A droplet ejection device (inkjet device) that fabricates a device by ejecting a droplet from a droplet ejection head to a substrate can be used as the device fabrication apparatus.

FIG. 1 is a perspective drawing showing the schematic configuration of the droplet ejection apparatus.

The droplet ejection apparatus IJ provides a droplet ejection head 101, an X-axis direction drive axle 104, a Y-axis direction guide axle 105, a control device CONT, a stage 107, a cleaning mechanism 108, a platform 109, and a heater 115.

The stage 107 supports the substrate P to which the ink (fluid material) is applied by this droplet ejection apparatus IJ, and provides a fastening mechanism (not illustrated) that fastens the substrate P at a standard position.

The droplet ejection apparatus 101 is a multi-nozzle type droplet ejection head that provides a plurality of nozzles, and the longitudinal direction and the X-axis direction are made to coincide. The plurality of ejection nozzles are provided at a regular interval arranged in the Y-axis direction on the lower surface of the droplet ejection head 101. Ink that includes the conductive particles described above is ejected from the ejection nozzles 101 towards the substrate P supported by the stage 107.

An X-axis direction drive motor 102 is connected at the X-axis direction drive axle 104. The X-axis direction drive motor 102 is a stepping motor or the like, and when an X-direction drive signal is supplied from the control device CONT, the X-axis direction drive axle 104 rotates. When the X-axis direction drive axle 104 rotates, the droplet ejection head 101 is moved in the X-axis direction.

The Y-axis direction guide axle 105 is fastened so as not to move with respect to the platform 109. The stage 107 provides a Y-axis direction drive motor 103. The Y-axis direction drive motor 103 is a stepping motor or the like, and when a Y-axis direction drive signal is supplied the from the control device CONT, the stage 107 is moved in the Y-axis direction.

The control device CONT supplies a voltage for the discharge control of the droplet to the droplet ejection head 101. In addition, a drive pulse signal that controls the movement of the droplet ejection head 101 in the X-axis direction is supplied to the X-axis direction drive motor 102, and a drive pulse signal that controls the movement of the stage 107 in the Y-axis direction is supplied to the Y-axis direction drive motor 103.

The cleaning mechanism 108 cleans the droplet ejection head 101. A Y-axis direction drive motor (not illustrated) is provided in the cleaning mechanism 108. Due to the drive of the Y-axis direction drive motor, the cleaning mechanism 108 moves along the Y-axis direction guide axle 105. The movement of the cleaning mechanism 108 is controlled by the control device CONT.

The heater 115 is a device that heat treats the substrate P by lamp annealing, and carries out vaporization and drying of the medium that contains the liquid material that is applied to the substrate P.

The droplet ejection device IJ ejects the droplet to the substrate P while scanning relative to the droplet ejection head 101 and the stage 107 that supports the substrate P. Here, in the following explanation, the X-axis direction is the scanning direction and the Y-axis direction perpendicular to the X-axis direction is the non-scanning direction. Therefore, the ejection nozzle of the droplet ejection heads 101 are provided arranged at regular intervals in the Y-axis direction, which is the non-scanning direction. Note that in FIG. 1, the droplet ejection head 101 is disposed at a right angle with respect to the forward direction of the substrate P, but the it is also possible to adjust the angle of the droplet ejection head 101 so that the droplet ejection heads 101 intersects in the forward direction of the substrate P. In this manner, by adjusting the angle of the droplet ejection head 101, it is possible to adjust the pitch between the nozzles. In addition, it is also possible to adjust arbitrarily the distance between the substrate P and the nozzle surface.

Figure 2:
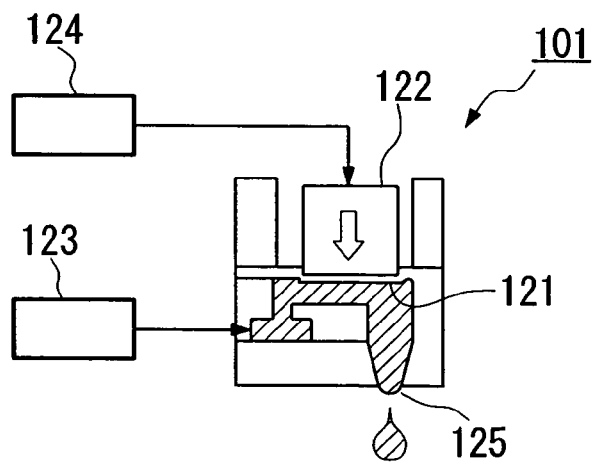
FIG. 2 is a drawing for explaining the ejection principle of the liquid body according to the piezoelectric method.

FIG. 2 is a drawing for explaining the ejection principle of the fluid material according to the piezoelectric method.

In FIG. 2, a piezoelectric element 122 is disposed adjacent to a fluid chamber 121 that accommodates a liquid material (wiring pattern ink, function liquid). The fluid material is supplied to the fluid chamber 121 via a fluid material supply system 123 that includes a material tank that accommodates the fluid material. The piezoelectric element 122 is connected to a drive circuit 124, a voltage is applied to the piezoelectric element 122 via the drive circuit 124 causing the piezoelectric element 122 to be deformed. Thereby, the fluid chamber 121 is deformed and thereby the fluid material is ejected from the nozzle 125. In this case, the deformation amount of the piezoelectric element 122 can be controlled by changing the value of the applied voltage. Thus, there is the advantage that the composition of the material is difficult to influence because the droplet ejection by the piezoelectric method does not apply heat to the material.

Figure 3A:
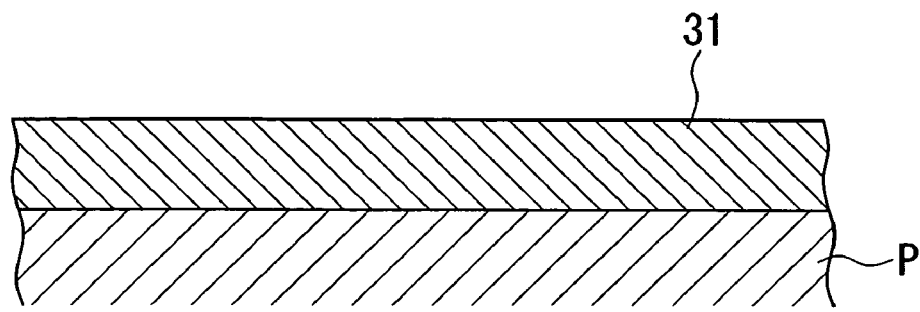
FIG. 3A to 3C are drawings showing the wiring pattern formation sequence.

Next, as an example of an embodiment of the wiring pattern formation method of the present invention, the method in which the conducting film wiring is formed on a substrate will be explained with reference to FIGS. 3A to 3C. The wiring pattern formation method according to the present embodiment disposes ink for the wiring pattern on the substrate, and forms the conducting film pattern for the wiring on this substrate. The wire pattern formation method generally consists of a bank formation step, a concave part formation step, a residue treatment step, a liquid repelling treatment step, a material disposition step and intermediate drying step, a baking step, and a bank removal step.

Below, each of the steps will be explained in detail.

Bank Formation Step

A bank is a member that functions as a defining member, and the formation of a bank can be carried out by any arbitrary method, such as a lithographic method or a printing method. For example, in the case of using lithographic method, as shown in FIG. 3A, an organic photosensitive material 31 is applied in alignment with the height of the banks on the substrate P by using a predetermined method such as spin coating, spray coating, roll coating, die coating, dip coating or the like, and a resist layer is applied thereto. In addition, in conformity with the bank profile (the wiring pattern), masking is carried out, the resist is exposed and developed, and thereby a resist remains that conforms to the bank profile. Finally, etching is carried out, and bank material in parts that are outside the mask is removed. In addition, a bank (convex part) can be formed using two layers, where the lower layer is material consisting of an organic or inorganic substance and has liquid-affinity with respect to the function liquid, and the upper layer is a material consisting of an organic substance and is water-repelling.

Figure 3B:
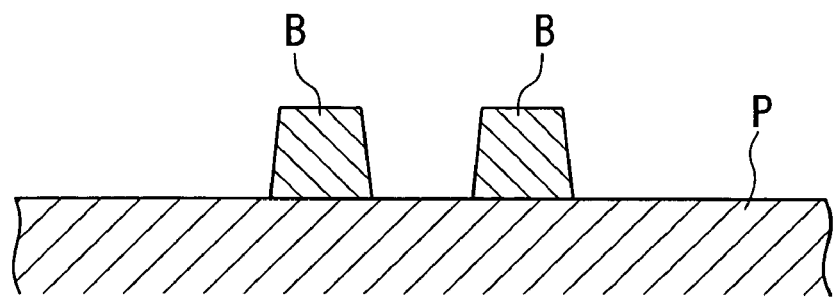

Thereby, as shown in FIG. 3B, banks B and B are built up, for example, at a 10 μm, so as to surround the vicinity of the region in which the wiring pattern is to be formed.

Note that with respect to the substrate P, as a surface improvement treatment before the organic material application, HMDS treatment can be carried out (a method in which $(CH_3)_3SiNHSi(CH_3)_3$ is applied by vaporization), but in FIG. 3, the illustration thereof is omitted.

A material that exhibits a liquid repellency with respect to the fluid material can be used as the organic material to form the banks, and as will be described below, an insulating organic material that can impart a liquid repellency (Teflon (registered trademark)) by using a plasma treatment, has a good adhesiveness to the lower substrate, allows easy patterning using photolithography can be used. For example, it is possible to use a high molecular material such as an acryl resin, a polyimide resin, an olefin resin, a melanin resin or the like.

Concave Part Formation Step

Figure 3C:
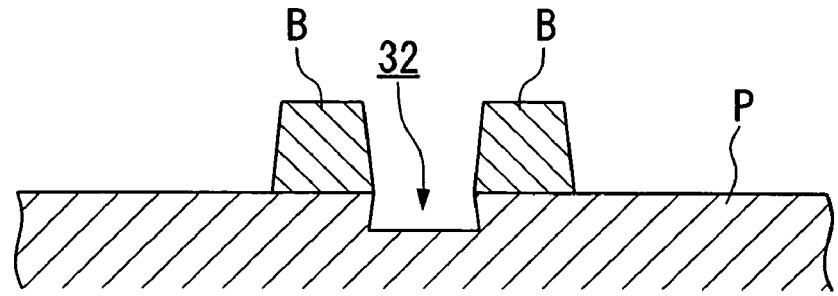

When the banks B and B have been formed on the substrate P, next, as shown in FIG. 3C, a concave part 32 is formed on the substrate P between the banks B and B. Concretely, the banks serve as the mask with respect to the substrate P on which banks B and B have been formed, and the concave part 32 is formed by etching by using, for example, SF6. At this time, using the etching time as a parameter, the depth of the concave part 32 is adjusted to a predetermined value (for example, 2 μm). Thereby, the substrate P is etched, and as shown in the figure, a concave part 32 having a reverse-taper cross-sectional profile, which gradually widens towards the base, is formed.

Residue Treatment Step (Liquid-affinity Treatment Step)

Next, the substrate P undergoes residue treatment in order to remove the resist (organic material) residue from bank formation.

As a residue treatment, it is possible to select an ultraviolet (UV) irradiation treatment that carried out the residue treatment by irradiation with ultraviolet light, an $O_2$ plasma treatment in which oxygen in the atmosphere serves as the treatment gas, and the like. Here, $O_2$ plasma treatment is carried out.

Concretely, this is carried out by irradiating the substrate P with oxygen plasma from a plasma discharge electrode. The conditions for the $O_2$ plasma treatment are, for example, a plasma power between 50 to 1000 W, an oxygen gas flow rate of 50 to 100 mm/sec, a conveyance speed for the substrate P of 0.5 to 10 mm/sec, and a substrate temperature of 70 to 90° C. Note that in the case in which the substrate P is a glass substrate, the surface thereof has liquid-affinity with respect to the wire pattern formation material, but like the present embodiment, it is possible to increase the liquid-affinity of the concave part 32 by carrying out $O_2$ plasma treatment and ultraviolet light irradiation treatment for the residue treatment.

Liquid-Repelling Treatment Step

Next, a liquid-repelling treatment is carried out on the banks B and B, and water-resistance is imparted to the surface thereof. It is possible to use a plasma treatment method ($CF_4$ plasma treatment method) in the atmosphere, in which tetrafluoromethane is used as the treatment gas. The conditions for the $CF_4$ plasma treatment are, for example, a plasma power between 50 to 1000 W, an $CF_4$ flow rate of 50 to 100 ml/min, a substrate conveyance speed of 0.5 to 1020 mm/sec, and a substrate temperature of 70 to 90° C.

Note that the treatment gas is not limited to $CF_4$, by other fluorocarbon type gases can be used.

By carrying out this type of liquid-repelling treatment, a fluorine group is introduced into the resin that forms the banks B and B, and a high water-resistance is imparted to the concave part 32. Note that the $O_2$ plasma treatment used as a liquid-affinity treatment can be carried out before formation of the banks B. However, because acrylic resins, polyimide resins and the like have the property that fluoridating is easier when pretreatment using an $O_2$ plasma is carried out, preferably the $O_2$ plasma treatment is carried out after the bank B has been formed.

Note that although there is a small influence on the substrate P surface that has undergone the liquid-affinity treatment first due to the liquid-affinity treatment of the banks B and B. In particular, in the case in which the substrate P consists of glass or the like, the introduction of the fluoride group occurs with difficulty due to the liquid-repelling treatment, and thus, the liquid-affinity, i.e., the wettability, of the substrate P is not substantially lost.

In addition, the liquid-repelling treatment for the banks B and B can be omitted by forming them with a material (for example, a resin material having a fluorine group) that is water-repelling.

Material Disposition Step and Intermediate Drying Step

Next, using a droplet ejection method employing the droplet ejection device IJ, the wiring pattern formation material is applied to the concave part 32 on the substrate P. Note that here an ink is ejected in which silver is used as the conductive particle, and diethylene glycol diethylether is used as the medium (dispersion medium).

Figure 4D:
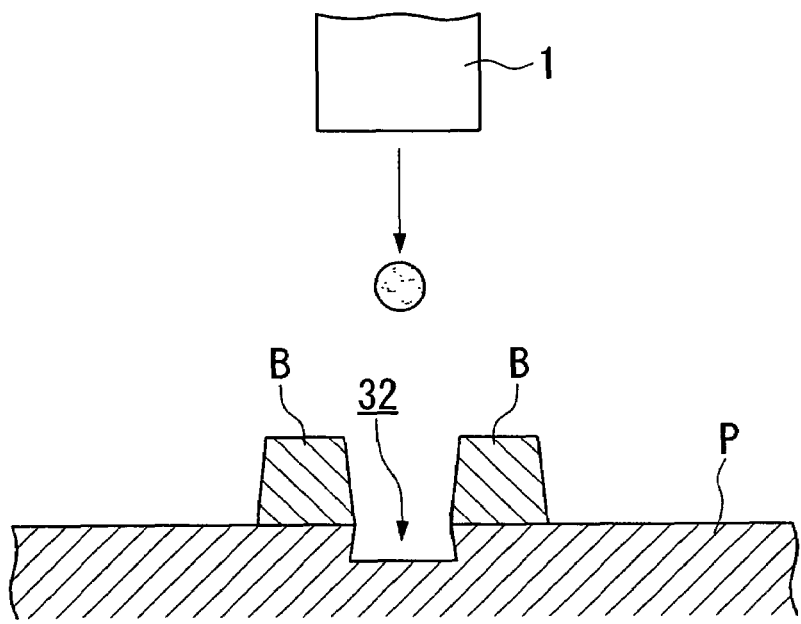
FIG. 4D to 4F are drawings showing the wiring pattern formation sequence.
Figure 4E:
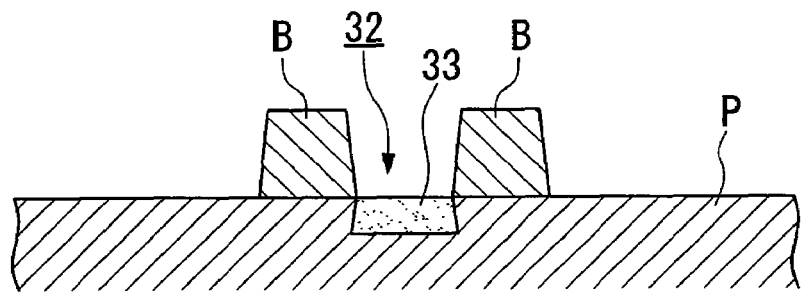

Specifically, in the material disposition step, as shown in FIG. 4D, the fluid material that includes a wiring pattern formation material is formed into a droplet and ejected from the droplet ejection head 101, and this droplet is disposed in the concave part 32 on the substrate P. Conditions for the droplet ejection are an ink weight of 4 ng/dot, and an ink speed (ejection speed) of 5 to 7 m/sec.

At this time, because the concave part 32 is surrounded by the banks B and B, it is possible to prevent the liquid from spreading beyond the predetermined position. In addition, because the banks B and B have had water resistance imparted, even if a part of the ejected drop lands on the bank B, it will be repelled from the bank B, and flow down into the concave part 32 between the banks. Furthermore, because a liquid-affinity has been imparted to the concave part 32, the ejected fluid spreads easily within the concave part 32, and thereby the fluid can fill the concave part 32 evenly within a predetermined location.

Intermediate Drying Step

After ejecting the droplet onto the substrate P, a drying treatment is carried out as necessary in order to remove the dispersion medium. The drying treatment can be carried out by a heating treatment that uses, for example, a normal hotplate or electric furnace that heats the substrate P. In the present embodiment, for example, the step is carried out at 180° C. for about 60 minutes. This heating can be carried out in an $N_2$ atmosphere or the like, and it is not always necessary to carry it out in the atmosphere.

In addition, this drying treatment can be carried out by lamp annealing. While not particularly limited, the light source for the light used in the lamp annealing can be an infrared lamp, a xenon lamp, a YAG laser, argon laser, a carbon gas laser, or an excimer laser such as XeF, XeCl, XeBr, KrF, KrCl, ArF, or ArCl. These light sources are generally used within an output range equal to or greater than 10 W and equal to or less than 5000 W, but in the present embodiment, a range equal to or greater than 100 W and equal to or less than 5000 W is sufficient.

By repeatedly carrying out the intermediate drying step and the material disposition step described above, as shown in FIG. 4E, the thin film of the wiring pattern (thin film pattern) 33 is formed so as not to protrude from the surface (preferably substantially flush to the surface) of the substrate P.

Baking Step

The dry film after the ejection step is to improve the electrical connection between particles, and the dispersing medium must be completely removed. In addition, in the case in which the surface of the conductive particles is coated with coating material such as an organic substance in order to improve the dispersibility, it is necessary to remove the coating material. Thus, heat treatment and/or light irradiation treatment is carried out on the substrate after the ejection step.

The heat treatment and/or light irradiation treatment are normally carried out in the atmosphere, but depending on necessity, the treatments can also be carried out in an inert gas atmosphere such as nitrogen, argon, or helium. The treatment temperature during the heat treatment and/or light irradiation treatment is suitably set taking into account the boiling point (vapor pressure) of the diffusion medium, the type and pressure of the atmosphere gas, the thermal behavior of the dispersibility and oxidizing properties of the particles, the presence or absence of the coating material and the amount thereof if present, the heat resistance temperature of the substrate, and the like.

For example, in order to remove a coating material consisting of an organic substance, baking must be carried out at approximately 300° C. In addition, in the case in which a substrate such as plastic is used, preferably the temperature is greater than or equal to room temperature and equal to or less than 100° C.

Due to the above steps, the electrical contact between the particles in the dry film after the ejection step is guaranteed, and the film is converted into a conducting film.

Bank Removal Step

In this step, the banks B and B that are present around the concave part 32 are removed by an ashing separation treatment. Plasma ashing, ozone ashing, or the like can be used as the ashing treatment.

In plasma ashing, a gas such as a plasma oxygen gas and the banks (resist) are reacted, and the banks are stripped and removed by vaporization. The banks are solid materials formed from carbon, oxygen, and hydrogen, and by chemically reacting these with an oxygen plasma, $CO_2$, $H_2O$, and $O_2$ are generated, and it is possible to strip all of a bank as a vapor.

At the same time, the fundamental principle of ozone ashing is the same as plasma ashing. $O_3$ (ozone) is decomposed and converted into the reaction gas $O^+$ (oxygen radical), and this $O^+$ and the banks react together. A bank that has reacted with the $O^+$ is converted to $CO_2$, $H_2O$, and $O_2$, and the entire bank is stripped as vapor.

Figure 4F:
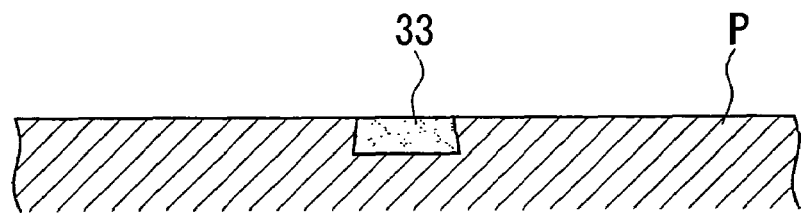

By carrying out the ashing stripping treatment on the substrate P, as shown in FIG. 4F, the banks are removed from the substrate P.

In the above manner, in the present embodiment, the concave part 32 is formed in the substrate P and a droplet of a function liquid is ejected into this concave part 32. Thereby, it is possible to form a wiring pattern 33 that does not protrude from the substrate P, it becomes possible to make the devices formed by the wiring pattern in the substrate thin, and furthermore, it becomes possible to realize increased integration when laminating the wiring pattern across a plurality of surfaces on the substrate. In addition, in the present embodiment, the wiring pattern 33 is formed so as not to protrude from the surface of the substrate P, and thus the flatness is improved, and it becomes possible to carry out easily the subsequent steps such as forming the insulating film.

Furthermore, when forming the concave part 32 in the present embodiment, the banks B and B are used as masks, and thus the fabrication of special use masks and the setting of the masks on the substrate become unnecessary, and thereby it is possible to improve the productivity. Furthermore, in the present embodiment, a liquid repellency is imparted to the banks B and B, and thus even if a part of an ejected droplet lands on a bank B, the ink flows down into the concave part 32, and thereby it is possible to apply the liquid more evenly, and it becomes possible to obtain a wiring pattern 33 having a uniform film thickness.

In addition, in the present embodiment, because the concave part 32 is formed so as to have a reverse taper cross-section, the wiring pattern 33 becomes difficult to strip off after baking, and it becomes possible to improve the device quality.

Second Embodiment

Next, the fabricating method for the liquid crystal device of the present invention and the liquid crystal display fabricated by using this manufacturing method are explained below with reference to the figures. First, the fabricating method of the liquid crystal display of the present embodiment will be explained with reference to FIG. 5 to FIG. 14.

Figure 5:
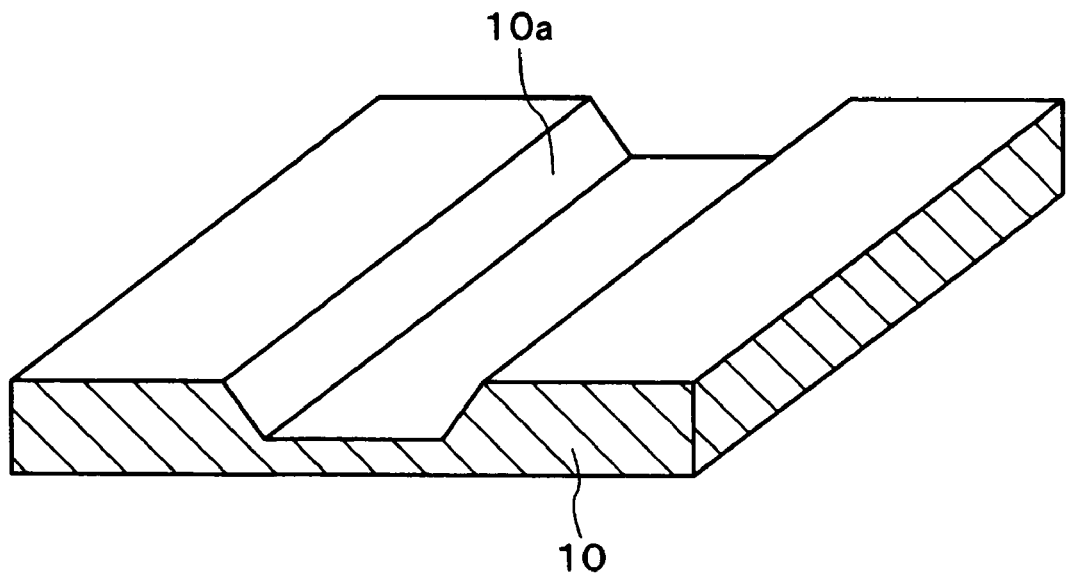
FIG. 5 is a drawing showing an embodiment of the fabricating method for the liquid crystal display of the present invention.

As shown in FIG. 5, in the substrate groove formation step, in the upper surface of a cleaned glass substrate 10, substrate grooves 10a having grove width of 1/20 to 1/10 that of the pitch of one pixel are applied by photoetching. Preferably, as shown in the figure, a forward-taper (a tapered profile that opens toward the ejection source) is used. Thereby, it becomes possible for the ejected droplet to fill the grooves down to the bottom.

Figure 6:
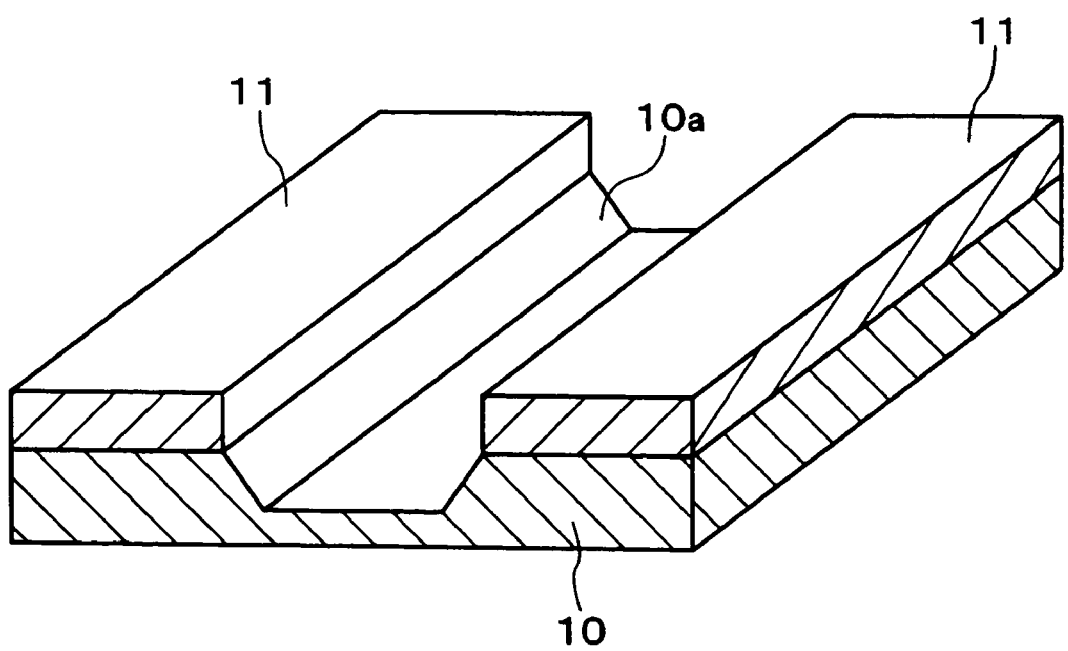
FIG. 6 is a drawing showing the continuation of the same fabricating method, and is a partial perspective drawing showing the step in which the banks are formed.
Figure 7:
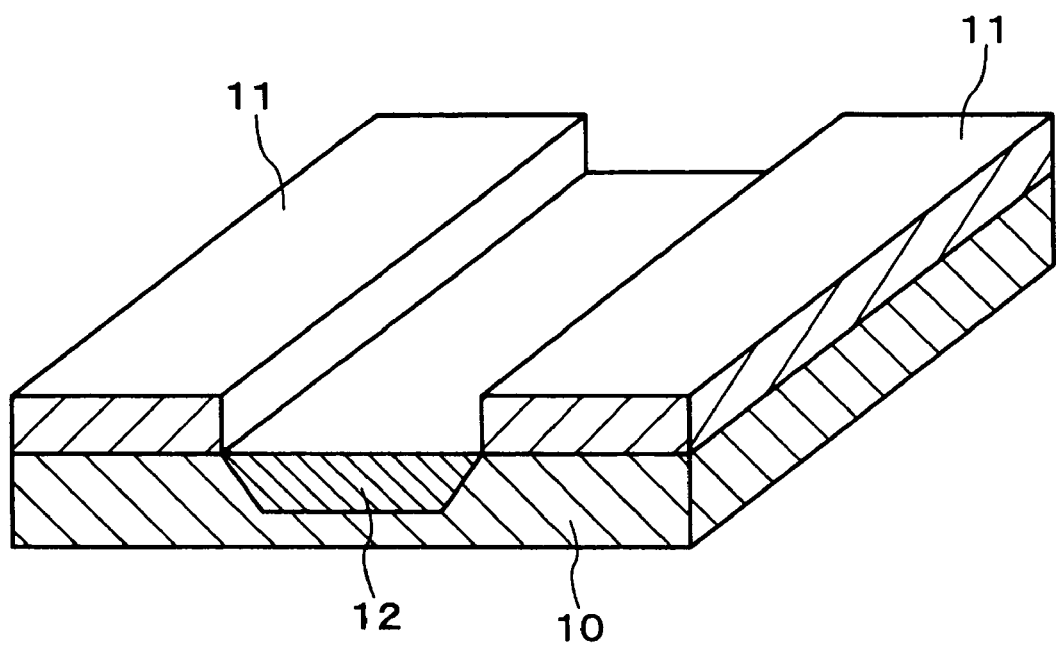
FIG. 7 is a drawing showing the continuation of the same fabricating method, and is a partial perspective drawing showing the step in which the gate scanning line electrode is formed.

Next, as shown in FIG. 6, in the liquid repelling part formation step, banks 11 are formed by lithography as a liquid repelling part that partitions the substrate groove 10a. These banks must be provided with a liquid repellency, and a high molecular material such as acryl resin, polyimide resin, olefin resin, melanin resin or the like can be suitable used as this material.

In order to provide a liquid repellency to the banks 11 after formation, it is necessary to carry out $CF_4$ plasma treatment (plasma treatment in which a gas incorporating a fluoride component is used), but instead, the material of the banks 11 itself can include a liquid repelling material (a fluorine group or the like) in advance. In this case, the $CF_4$ plasma treatment can be omitted.

The contact angle of the liquid repelling banks 11 with respect to the ejected ink is preferably guaranteed to be 40° or greater. Specifically, as a result of experimental confirmation by the inventors, a after treatment contact angle of 66.2 (10° or less when untreated) with respect to, for example, an organic silver compound (a diethylene glycol dimethyl ether solvent) can be guaranteed when using an organic material as the material for the banks 11, and an angle of 49.0° (10° or less when untreated) can be guaranteed when an inorganic material is used. Note that these contact angles are obtained under treatment conditions in which the plasma power is 550 W and the tetrafluoromethane gas is supplied at 0.11 ml/min.

In addition, as a result of experimental confirmation by the inventors, a contact angle of 104.1° (10° or less when untreated) after treatment with respect to pure water can be guaranteed when using an organic material as the material for the banks 11, and a contact angle of 96.3° (10° or less when untreated) can be guaranteed when an inorganic material is used.

In the gate scanning line electrode formation step (the first conductive pattern formation step) that follows the liquid repelling part formation step described above, as shown in FIG. 7, a gate scanning line electrode 12 is formed by ejecting droplets that include a conducting material using an ink jet so as to fill the substrate groove 10a, which is the formation region defined by the banks 11. Ag, Al, Au, Cu, palladium, Ni, W—Si, conducting polymers and the like can be used as the conducting material here. The gate scanning line electrode 12 formed in this matter can impart a sufficient liquid repellency to the banks 11, and thus it is possible to form a fine wiring pattern that does not protrude from the substrate groove 10a.

Figure 8:
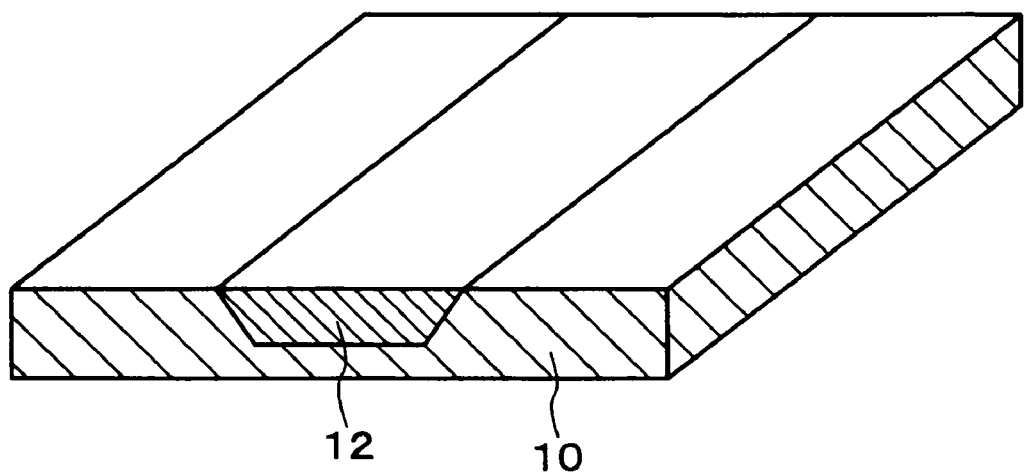
FIG. 8 is a drawing showing the continuation of the same fabricating method, and is a partial perspective drawing showing the step in which the banks are removed.
Figure 9:
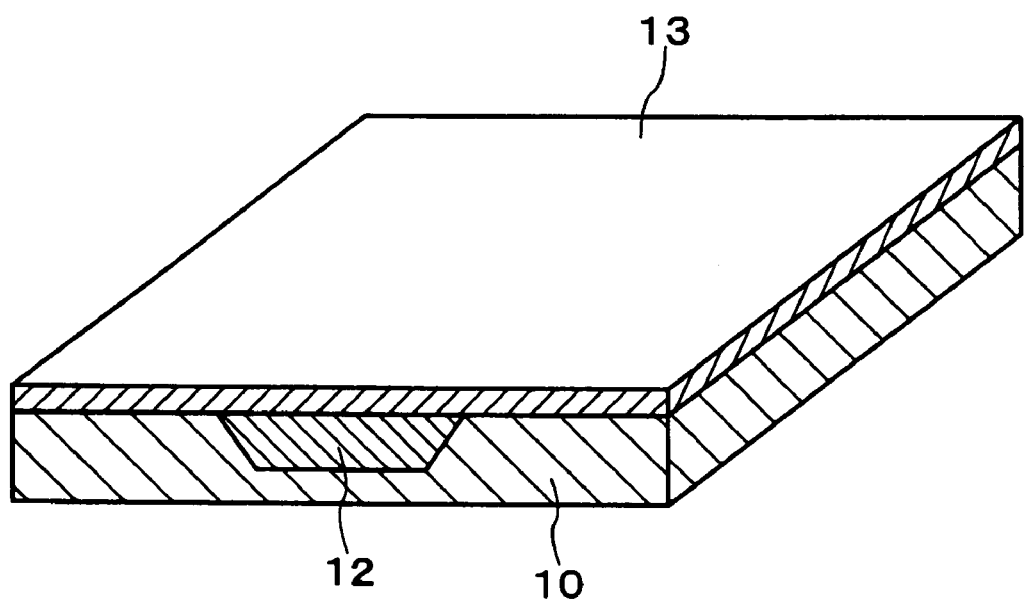
FIG. 9 is a drawing showing the continuation of the same fabricating method, and is a partial perspective drawing showing the step in which the gate scanning line electrode is formed.
Figure 10:
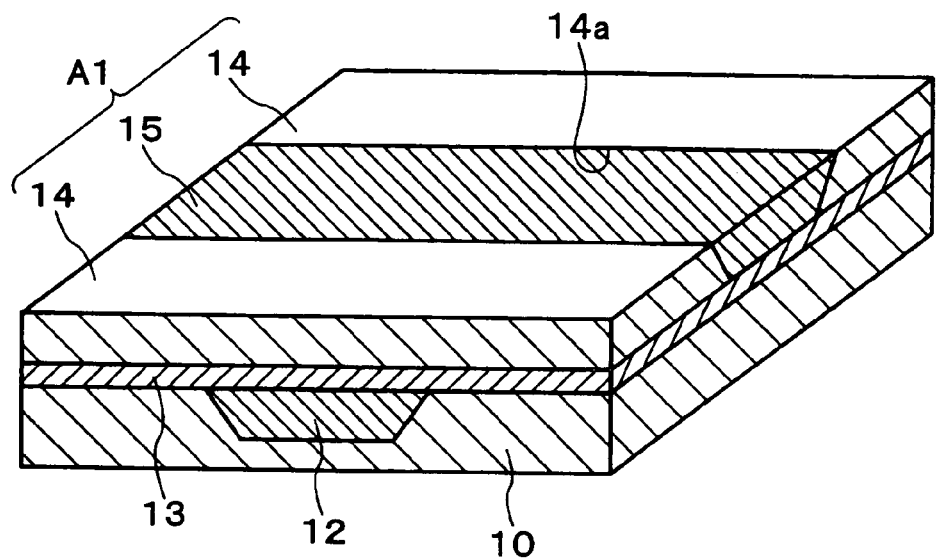
FIG. 10 is a drawing showing the continuation of the same fabricating method, and is a partial perspective drawing showing the step in which the banks and source electrode are formed.
Figure 11:
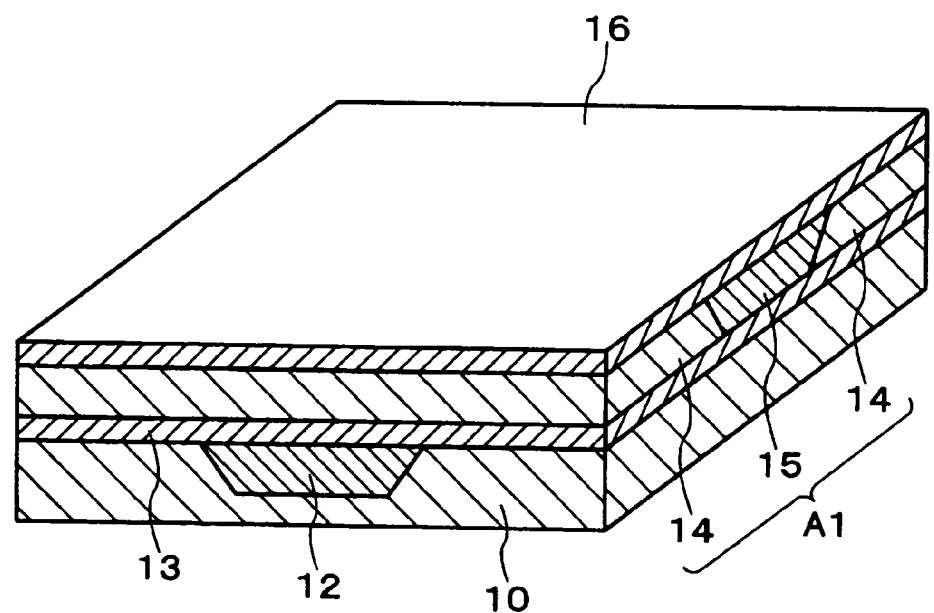
FIG. 11 is a drawing showing the continuation of the same fabricating method, and is a partial perspective drawing showing the step in which the source line insulation film is formed.

In the bank removal step (liquid repelling part removal step) that follows the gate scanning line electrode formation step, as shown in FIG. 8, all of the banks 11 are removed from the upper surface of the glass substrate 10. Thereby, the upper surface of the glass substrate 10 acquires a flat surface profile in which the substrate groove 10a is filled with the gate scanning line electrode 12.

In the insulating layer formation step (the first insulating layer formation step) that follows the removal step described above, as shown in FIG. 9, a TFT (thin film transistor) consisting of a thin film semiconductor and a gate scanning line insulating layer (insulating layer) 13 are formed so as to cover the upper surface of the gate scanning line electrode 12. $SiO_2$, $SiN_x$, BPSG, NSG and the like can be used as the material for this gate scanning line insulating layer 13.

Note that in the case in which $SiN_x$ is formed by a CVD method, a thermal history of 300° C. to 350° C. is necessary, but by using an inorganic material in the banks, it is possible to avoid problems related to transparency and heat resistance.

The gate scanning line insulating layer 13 formed in this matter is formed on a flat glass substrate 10, and thus provides a flat surface.

In the second bank formation step (bank formation step) that follows the first insulating layer formation step described above, as shown in FIG. 10, banks 14 are formed by lithography. These banks are for providing a groove 14a that is 1/20 to 1/10 the pitch of one pixel and intersects the substrate groove 10a. Transparency and a liquid repellency must be provided to the banks 14 after formation, and thus a high molecular material such as an acryl resin, a polyimide resin, an olefin resin, a melanin resin or the like can be suitably used as this material.

In order to provide a liquid repellency to the banks 14 after formation, it is necessary to carry out a $CF_4$ plasma treatment (a plasma treatment in which a has having a fluoride component has been used), but instead, the material of the banks 14 itself can include a liquid repelling material (a fluorine group or the like) in advance. In this case, the $CF_4$ plasma treatment can be omitted.

Thereby, the contact angle of the liquid repelling banks 14 with respect to the ejected ink is preferably guaranteed to be equal to or greater than 40°.

In the source electrode formation step (second conductive pattern formation step) that follows the second bank formation step described above, as shown in the same FIG. 10, a droplet that includes a conducting material is ejected by an ink jet so as to fill the groove 14a, which is the formation region defined by the banks 14. Thereby, a source electrode 15 is formed that intersects the gate scanning line electrode 12. Ag, Al, Au, C, palladium, Ni, W—Si, a conductive polymer or the like can be suitably used here as the conductive material. Because a sufficient liquid repellency to the banks 14 in advance, it is possible for the source electrode 15 to form a fine wiring pattern that does not protrude from the groove 14a.

By the step described above, a conductive layer Al is formed that provides a flat upper surface consisting of banks 14 and a source electrode 15 on the substrate 10.

In the second insulating layer formation step (second insulating layer formation step) that follows the source electrode formation step described above, as shown in FIG. 11, a source line insulating film (second insulating layer) 16 is formed so as to cover the upper surface of the banks 14 and the source electrode 15. $SiO_2$, $SiN_x$, BPSG, NSG or the like can be used as the material for this source line insulating film 16.

Because the source line insulating film 16 formed in this manner is formed on the flat conductive layer Al, a flat upper surface can be provided.

Figure 12:
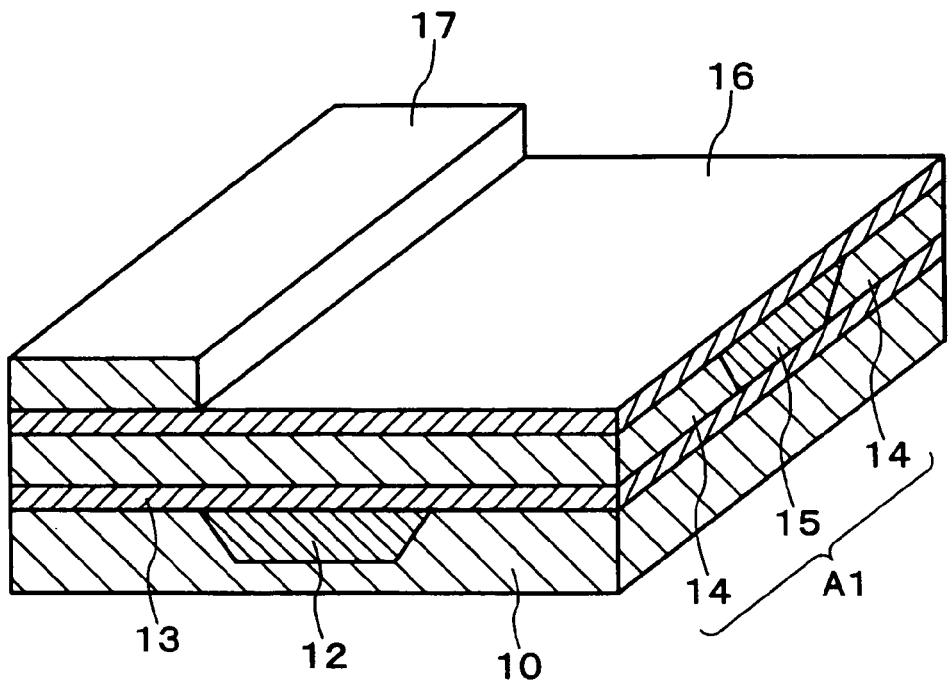
FIG. 12 is a drawing showing the continuation of the same fabricating method, and is a partial perspective drawing showing step in which the banks are formed.

In the third bank formation step following the second insulating film formation step, as shown in FIG. 12, except for the patterning region for the pixel electrode (ITO), a bank 17 is formed by photolithography on the upper surface of the source line insulating film 16. A high molecular material such as an acryl resin, a polyimide resin, an olefin resin, a melanin resin or the like can be appropriately used as the material for the bank 17.

Figure 13:
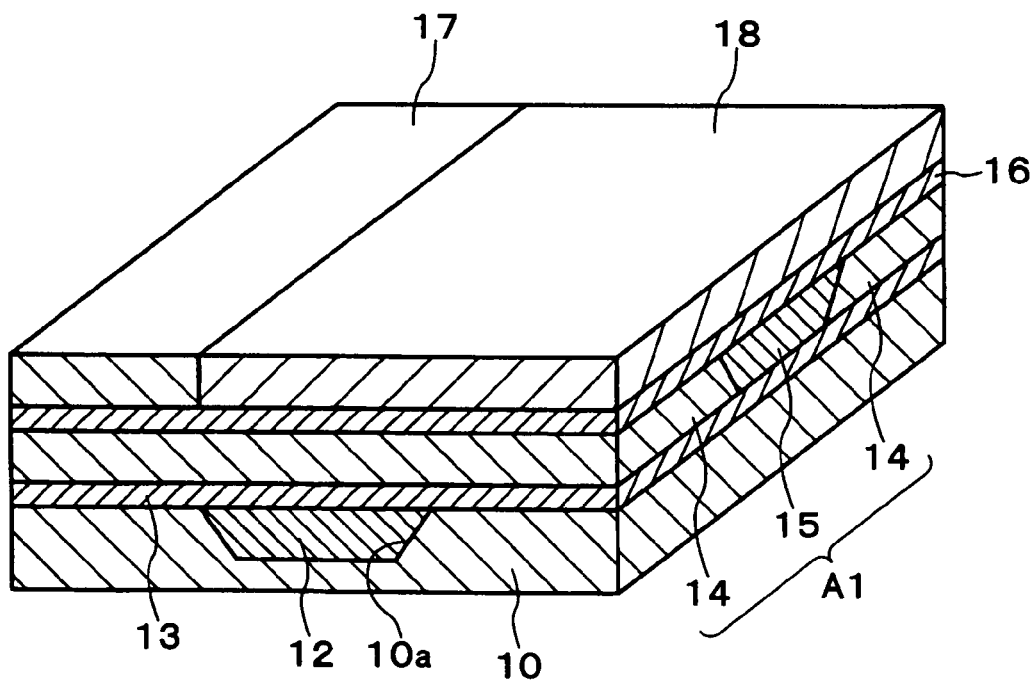
FIG. 13 is a drawing showing the continuation of the same fabricating method, and is a partial perspective drawing showing the step in which the pixel electrode is formed.
Figure 14:
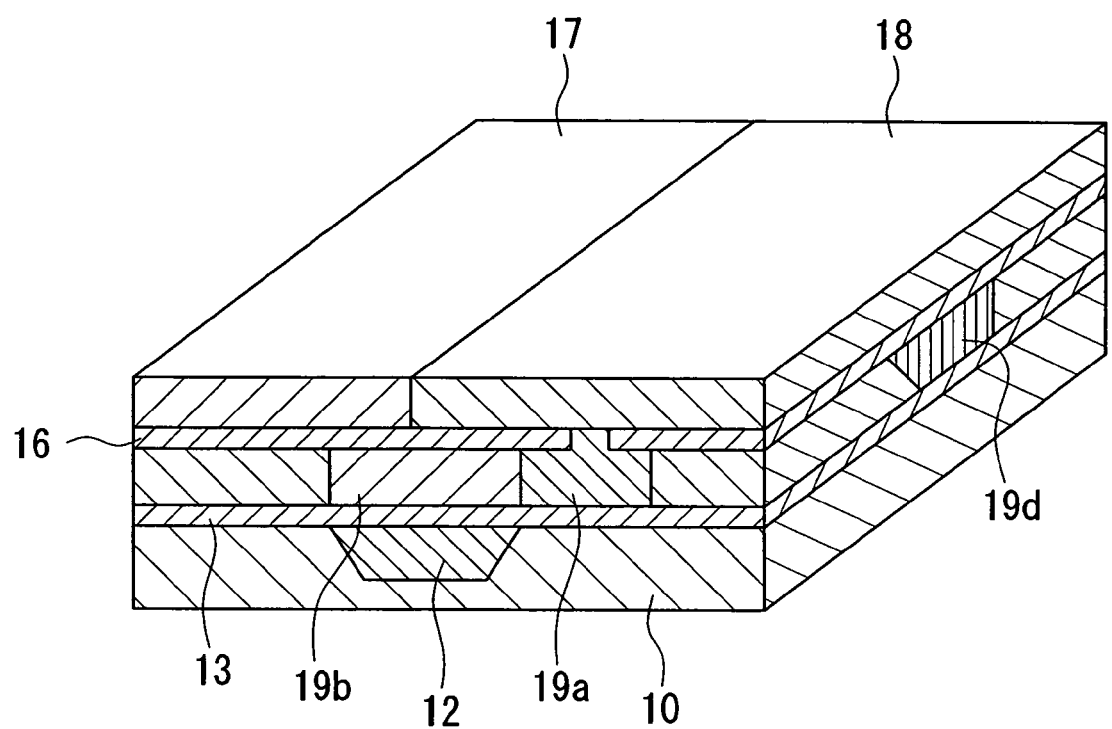
FIG. 14 is a partial perspective drawing showing an α-Si TFT device, which is another part formed by the fabricating method.

In the pixel electrode formation step that follows the third bank formation step, as shown in FIG. 13, a droplet that is the material for the pixel electrode is ejected by an ink jet into the region defined by the bank 17, and thereby the pixel electrode 18 is formed. The pixel electrode 18 formed in this manner is formed on the flat source line insulating film 16, and thus a flat surface is provided. Because the pixel electrode 18 and the bank 17 formed in this manner are formed on the flat source line insulating film 16, a flat upper surface can be provided.

Note that an α-si TFT device portion formed via each of the steps described above is shown in FIG. 14. In this figure, reference numeral. 19a denotes the drain electrode and reference numeral 19a denotes the channel region (α-si).

In addition, after the pixel electrode formation step, the lower substrate is completed by carrying out baking, orientation film formation, and rubbing treatment. In addition, by forming a liquid crystal layer between the lower substrate and the upper substrate fabricated separately, the liquid crystal display is completed (not illustrated).

According to the fabricating method for the liquid crystal display of the present embodiment described above, because the source line insulating film 16 is formed by leaving in place the banks 14 that would be usually be removed, it is possible to guarantee a surface profile that has fewer irregularities than a conventional one.

As explained above, after all the steps, the glass substrate 10 can guarantee a flat surface profile. Thereby, when implementing the rubbing treatment on the glass substrate 10, irregularities in the result occur with difficulty, and thereby it is possible to improve the liquid crystal orientation force and thus prevent display distortions. Thereby, it is possible to fabricate a liquid crystal display having few display distortions.

In addition, because the gate scanning line electrode 12 is formed so as to be embedded in the substrate groove 10a of the glass substrate 10, compared to the case in which the gate scanning line electrode 12 is formed on a glass substrate on which a substrate groove 10a is not formed, it is possible to make the thickness dimension of the substrate after completion thin.

Furthermore, because an ink jet is used in the formation of the gate scanning line electrode 12 and the capacity line 19d (refer to FIG. 14), the source electrode 15 and the drain electrode 19a, the pixel electrode 18, and the like, it is possible to eliminate needless waste material, and thus it is possible to reduce material costs.

Third Embodiment

Next, a fabricating method for a liquid crystal display of the present invention and the liquid crystal display fabricated by using this fabricating method will be explained below with reference to FIG. 15 to FIG. 22. Note that in these figures, essential elements identical to those in FIG. 5 through FIG. 14 shown in the second embodiment have identical reference numerals, and thus the explanation thereof is omitted.

Figure 15:
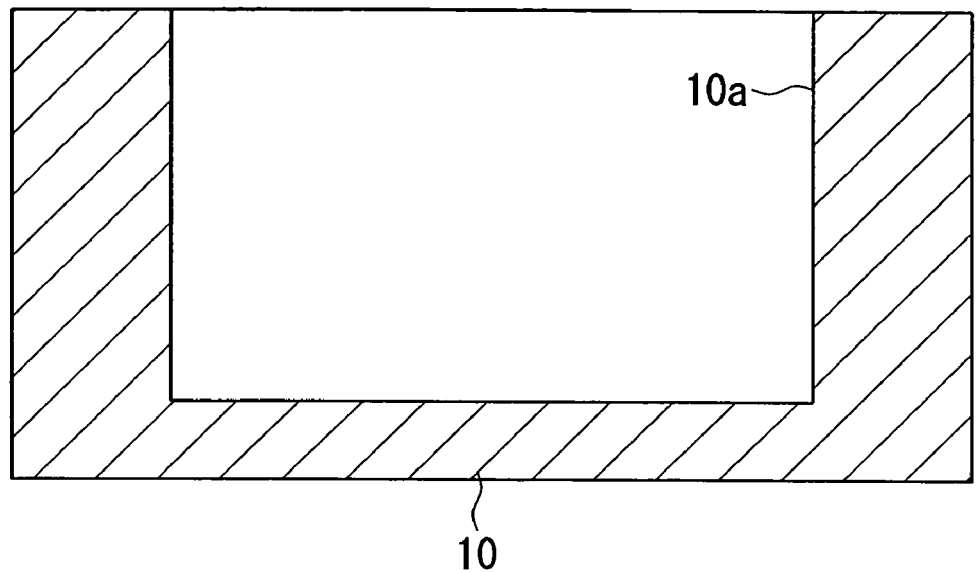
FIG. 15 is a drawing showing an embodiment of the fabricating method for the liquid crystal display of the present invention, and is a drawing of a longitudinal section showing the step in which the substrate is formed in the substrate.
Figure 19A:
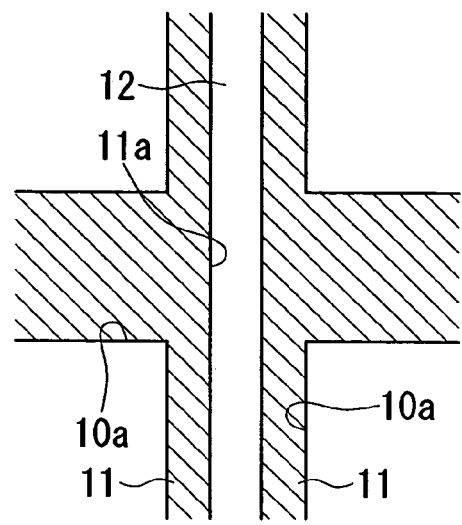
FIG. 19A is a drawing for explaining the fabricating method, and is a cross-sectional drawing along the line A-A in FIG. 21.
Figure 19B:
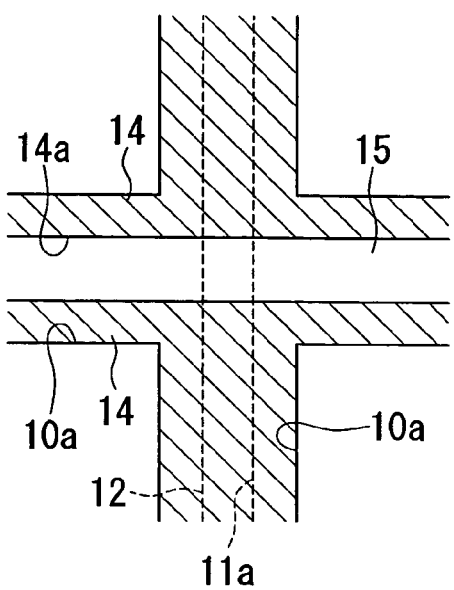
FIG. 19B is a drawing for explaining the fabricating method, and is a cross-sectional drawing along the line C-C in FIG. 21.

As shown in FIG. 15, in the substrate groove formation step, in the upper surface of a cleaned glass substrate 10, substrate grooves 10a having grove width of ½0 to ⅒ that of the pitch of one pixel are applied by photoetching. As shown in FIG. 19A and FIG. 19B, the substrate groove 10a is a groove in which the alternately traversing gate scanning line electrode 12, the capacity line 19c (explained below with reference to FIG. 22), the source electrode 15, and the drain electrode 19a (explained below with reference to FIG. 22) are embedded, and an island shape is formed in which two grooves alternately intersect each other separately to form a cross shape.

Figure 16:
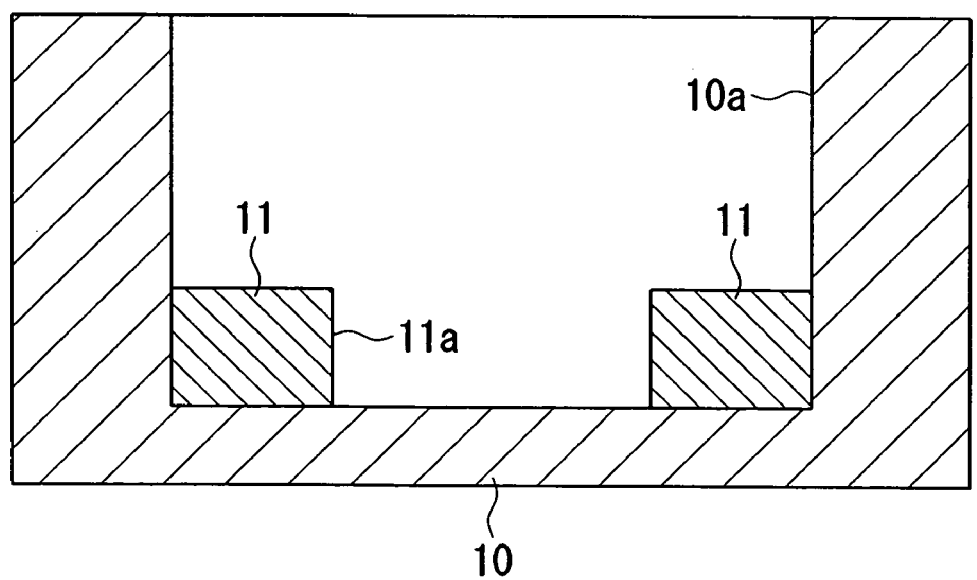
FIG. 16 is a drawing showing the continuation of the same fabricating method, and is a drawing of a longitudinal section showing the step in which the substrate grooves are formed in the substrate.
Figure 17:
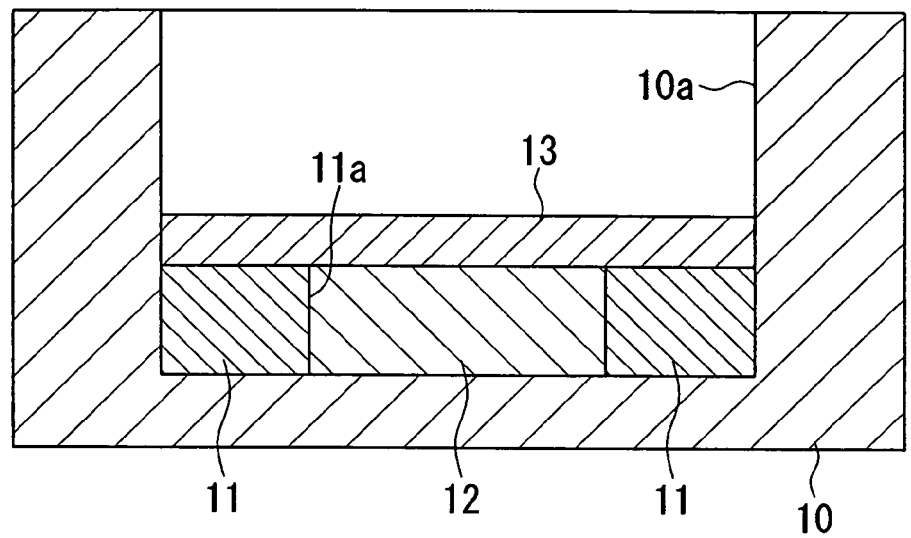
FIG. 17 is a drawing showing the continuation of the same fabricating method, and is a drawing of a longitudinal section showing the step in which the gate scanning line electrode and the gate scanning line insulating film are formed.

In the first bank formation step (first bank formation step) following this substrate groove formation step, as shown in FIG. 16 and FIG. 19A, on the bottom of the substrate groove 10a, the banks 11 are formed by photolithography. These banks 11 define the groove 11 a that demarks the gate scanning line electrode and the capacity line. These banks 11 must be provided with a liquid repellency, and a high molecular material such as an acryl resin, a polyimide resin, an olefin resin, a melanin resin, or the like can be suitably used as this material.

In order to provide a liquid repellency to the banks 11 after formation, it is necessary to carry out $CF_4$ plasma treatment (plasma treatment in which a gas incorporating a fluoride component is used), but instead, like the second embodiment, the material of the banks 11 itself can include a liquid repelling material (a fluorine group or the like) in advance.

In addition, in order to obtain an advantageous ejection result in the groove 11a between the banks 11, preferably a forward-taper (a tapered profile that opens toward the ejection source) is used as the profile of this groove 11a. Thereby, it becomes possible for the ejected droplet to fill the grooves down to the bottom.

In the gate scanning line electrode formation step (first conductive pattern formation step) that follows the first bank formation step described above, as shown in FIG. 17 and FIG. 19A, the gate scanning line electrode 12 is formed by ejecting a liquid that includes a conductive material by using an ink jet such that the groove 11a, which is the formation region defined by the banks 11, is filled. Ag, Al, Au, Cu, palladium, Ni, W—Si, conducting polymers and the like can be appropriately used as the conducting material here. The gate scanning line electrode 12 formed in this manner imparts in advance a sufficient liquid repellency to the banks 11, and thus it becomes possible to form a fine wiring pattern that does not project from the groove 11a.

In the first insulating layer formation step (first insulating layer formation step) that follows the gate scanning line electrode formation step described above, as shown in FIG. 17, at least the upper surface of the gate scanning line electrode 12 and the banks 11 is covered by the TFT consisting of a thin film semiconductor and the gate scanning line insulating film (insulating layer). Here, as shown in the figure, in the case in which the gate scanning line insulating film 13 is formed only inside the substrate groove 10a, it is possible to reduce the material cost thereof, and contrariwise, in the case in which the gate scanning line insulating film 13 is formed all at once over the entire surface of the glass substrate 10, including the substrate groove 10a, it is possible to reduce the fabrication costs by simplifying the fabrication. Note that in this figure, a thick gate scanning line insulating film 13 has been depicted for the sake of explanation, but the film thickness is actually a thin 1 μm, and thus even it is left on the surface of the glass substrate 10, no large step is formed between the interior of the substrate groove 10a and the surroundings thereof.

$SiO_2$, $SiN_x$, BPSC, NSG or the like can be used as the material for the gate scanning line insulating film 13.

Figure 18:
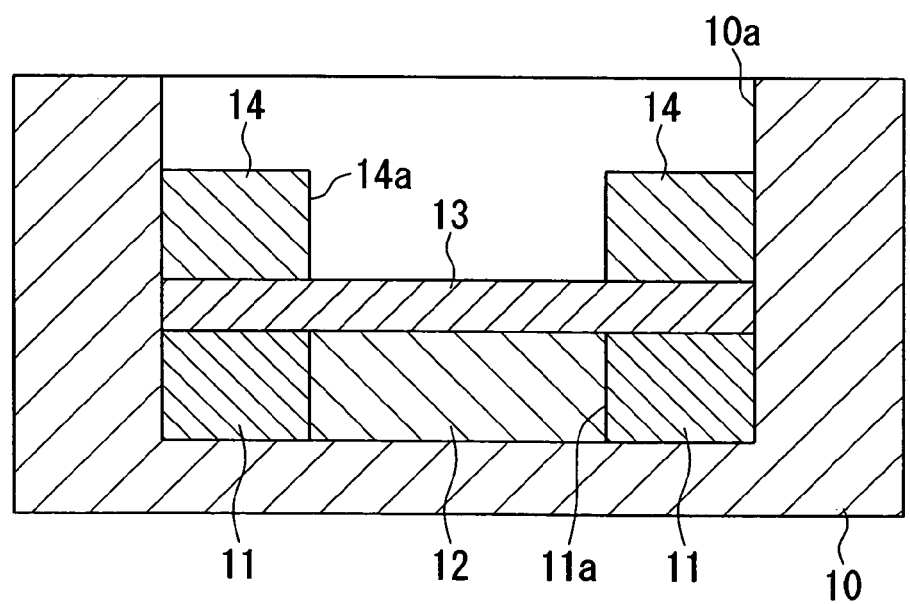
FIG. 18 is a drawing showing the continuation of the same fabricating method, and is a drawing of a longitudinal section showing the step in which the banks are formed on the gate scanning line insulating film.
Figure 20:
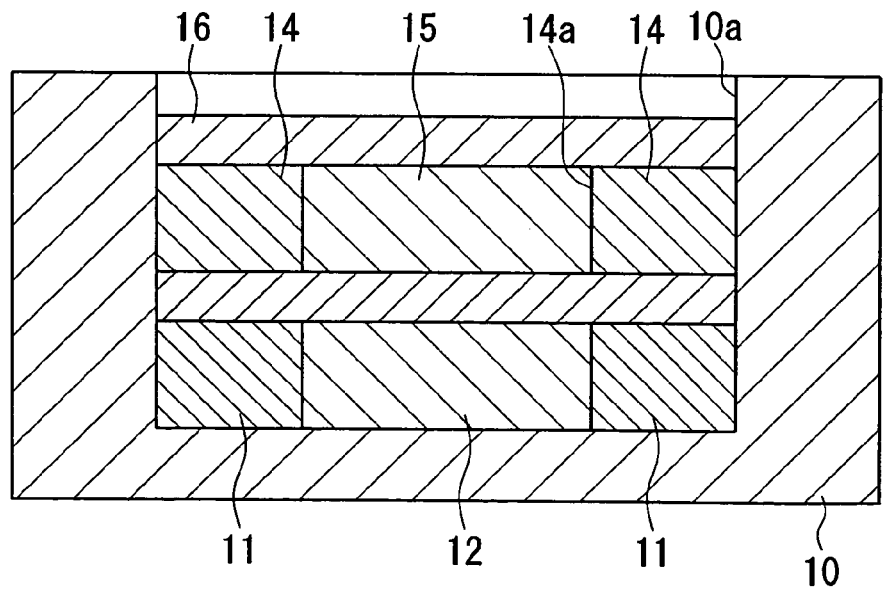
FIG. 20 is a drawing showing the continuation of the same fabricating method, and is a drawing of a longitudinal section showing the step in which the source electrode and the scanning line insulating film are formed.
Figure 21:
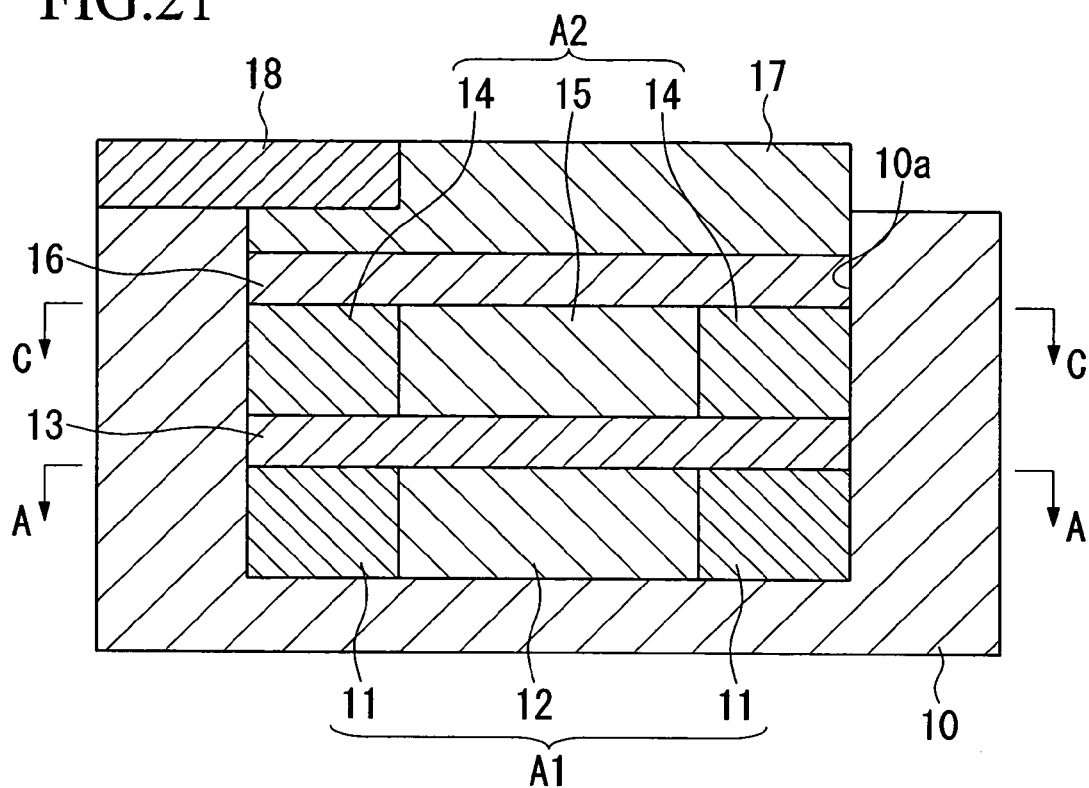
FIG. 21 is a drawing showing the continuation of the same fabricating method, and is a drawing of a longitudinal section showing the step in which the banks and pixel electrode are formed.
Figure 22:
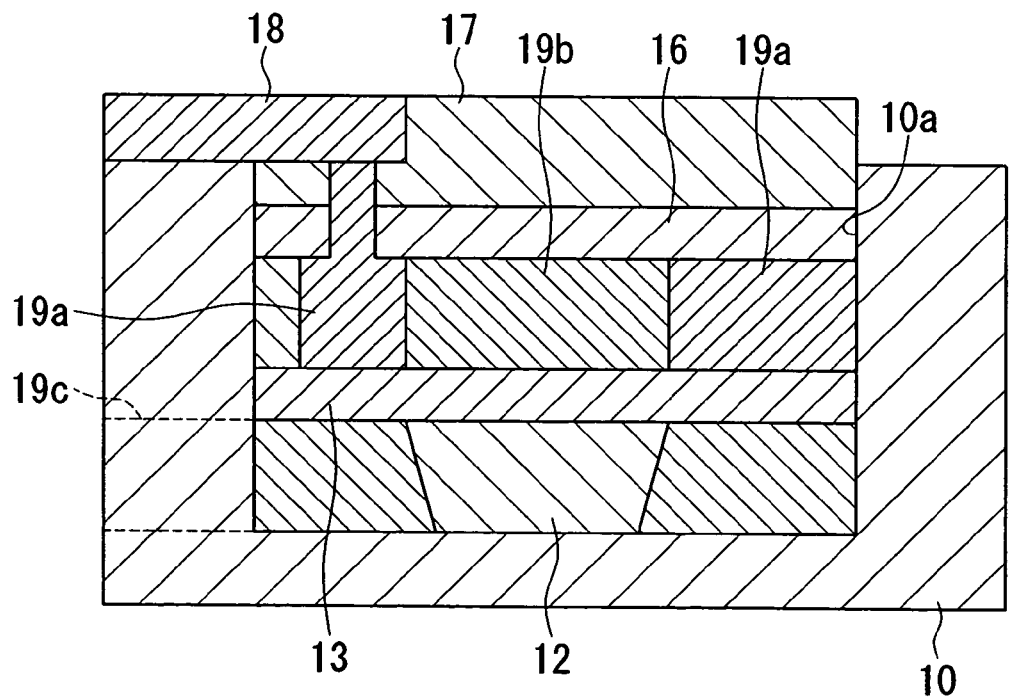
FIG. 22 is a partial perspective drawing showing an α-Si TFT device, which is another part formed by the fabricating method.

In the second pass bank formation step (second bank formation step) that follows the first insulating layer formation step described above, as shown in FIG. 18 and FIG. 199B, in the upper surface of the gate scanning line insulating film 13, banks 14 are formed by using photolithography that have a pitch that is 1/20 to 1/10 that of one pixel to provide a groove 14a that intersects the groove 11a. Note that in FIG. 18, for the sake of explanation the grooves 11a and 14a are depicted as being parallel to each other, but actually, as shown in FIG. 19B, they intersect each other. Similarly, the banks 14 and the groove 14a also intersect the banks 11 and groove 11a. Therefore, FIG. 18, FIG. 20, and FIG. 21 depict that the upper and lower layers that delimit the upper surface of the gate scanning line insulating film 13 actually intersect each other.

It is necessary to provide a liquid repellency to the banks 15 after formation, and high molecular materials such as acryl resin, polyimide resin, olefin resin, melanin resin and the like can be advantageously uses as the material therefore.

In order to provide a liquid repellency to the banks 14 after formation, it is necessary to carry out a $CF_4$ plasma treatment (a plasma treatment in which a has having a fluoride component has been used), but instead, the material of the banks 14 itself include a liquid repelling material (a fluorine group or the like) in advance. In this case, the $CF_4$ plasma treatment can be omitted. In addition, like a bank 11, when forming a bank 14, a forward-taper (a tapered profile that widens toward the ejection source) is preferably used.

In the second pass source electrode formation step (the second conductive pattern formation step) that follows the second bank formation step described above, as shown in FIG. 20, a droplet that includes a conducting material is ejected by using an ink jet so as to fill the interior of the groove 14a, which is the formation region defined by the banks 14. Thereby, the source electrode 15 that intersects the gate scanning line electrode 12 is formed. Ag, Al, Au, Cu, palladium, Ni, W—Si, conducting polymers and the like can be advantageously used as the conducting material here. The source electrode 15 formed in this manner imparts a sufficient liquid repellency to the banks 14, and thus it is possible to form a fine wiring pattern that does not protrude from the groove 14a.

In the second layer insulating layer formation step (the second insulating layer formation step) that follows the source electrode formation step described above, as shown in FIG. 20, at least the upper surface of the source electrode 15 and the banks 14 are covered source line insulating film (another insulating layer). Here, as shown in the figure, in the case in which source line insulating film 16 is formed only inside the substrate groove 10a, it is possible to reduce the material cost thereof, and contrariwise, in the case in which source line insulating film 16 is formed all at once over the entire surface of the glass substrate 10, including the substrate groove 10a, it is possible to reduce the fabrication costs by simplifying the fabrication. $SiO_2$, $SiN_x$, BPSC, NSG and the like can be used as the material for the source line insulating film 16.

Note that when $SiN_x$ is formed by using a CVD method, a thermal history of 300° C. to 350° C. is necessary, but by using an inorganic material in the banks, it is possible to avoid problems related to transparency and heat resistance.

In the pass third bank formation step that follows the second layer insulating film formation step described above, as shown in FIG. 21, a bank 17 is formed by lithography on the upper surface of the source line insulating film 16, except for the patterning region of the pixel electrode (ITO). A high molecular material such as acryl resin, polyimide resin, olefin resin, melanin resin, or the like can be advantageously used as the material for this bank 17.

In the pixel electrode formation step that follows the third pass bank formation step, as shown in FIG. 21, a droplet that is the material for the pixel electrode is ejected by an ink jet into the region defined by the banks 17, and thereby the pixel electrode 18 is formed. The pixel electrode 18 formed in this manner is formed flush with the upper surface of the banks 17, and thus a flat surface is provided.

Note that an α-si TFT device portion formed via each of the steps described above is shown in FIG. 22. In this figure, reference numeral 19a denotes the drain electrode and reference numeral 19b denotes the channel region (α-si).

By each of the steps described above, a first conductive layer A1 having a flat upper surface consisting of the banks 11, a gate scanning line electrode 12, and a capacity line 19d (refer to FIG. 22), a gate scanning line insulating film 13 having a flat upper surface formed in this conductive layer A1, a second conductive layer A2 that is formed on this gate scanning line insulating film 13 and similarly having a flat upper surface consisting of banks 14, a source electrode 15, and a drain electrode 19b, and a source line insulating film 16 similarly formed on this conductive layer A2 and having a flat upper surface are formed in the substrate groove 10a. The conductive layer A1, the gate scanning line insulating film 13, the conductive layer A2, and the source line insulating film 16 are embedded in the substrate groove 10a so as not to protrude therefrom. Therefore, only the bank 17 and the pixel electrode 18 protrude from the upper surface of the glass substrate 10. However, because the pixel electrode 18 is flush with the bank 17 and formed on the flat glass substrate 10, it is possible to guarantee a flat surface profile.

In addition, after the pixel electrode formation step, the lower substrate is completed by carrying out baking, orientation film formation, and rubbing treatment. In addition, by forming a liquid crystal layer between the lower substrate and the upper substrate fabricated separately, the liquid crystal display is completed (not illustrated).

According to the fabricating method for the liquid crystal display of the present embodiment described above, because wiring formation is carried out by filling the substrate groove 10a, which is concave, with a conductive layer A1, a gate scanning line insulating film 13, a conductive layer A2, and a source line insulating film 16, it is possible to guarantee a surface profile that has fewer irregularities than a conventional one. Thereby, when implementing the rubbing treatment on the glass substrate 10, irregularities in the result occur with difficulty, and thereby it is possible to improve the liquid crystal orientation force and thus prevent display distortions.

In addition, by embedding the conductive layers A1 and A2, which are the wiring portions, in the substrate groove 10a, it is possible to make the thickness dimension of the glass substrate 10 after completion thin in comparison to the case in which the substrate groove 10a is not provided and the wiring portion built up from the surface of the glass substrate 10.

Furthermore, because an ink jet is used in the formation of the gate scanning line electrode 12, the capacity line 19c (refer to FIG. 22), the source electrode 15, the drain electrode 19b, and the pixel electrode 18, it is possible to eliminate needless waste material, and thus it is possible to reduce material costs.

Fourth Embodiment

Next, as a fourth embodiment, a fabricating method for a liquid crystal display of the present invention and the liquid crystal display fabricated by using this fabricating method will be explained below with reference to FIG. 23 to FIG. 30. Note that in these figures, essential elements identical to those in FIG. 5 through FIG. 14 shown in the second embodiment have identical reference numerals, and thus the explanation thereof is omitted.

Figure 23:
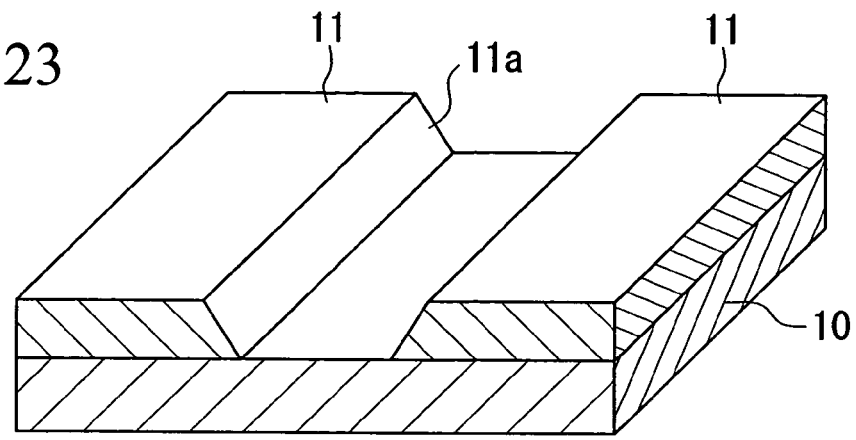
FIG. 23 is a drawing showing an embodiment of the fabricating method for the liquid crystal display of the present invention, and is a partial perspective drawing showing the step in which the first layer banks are formed on the lower substrate.
Figure 24:
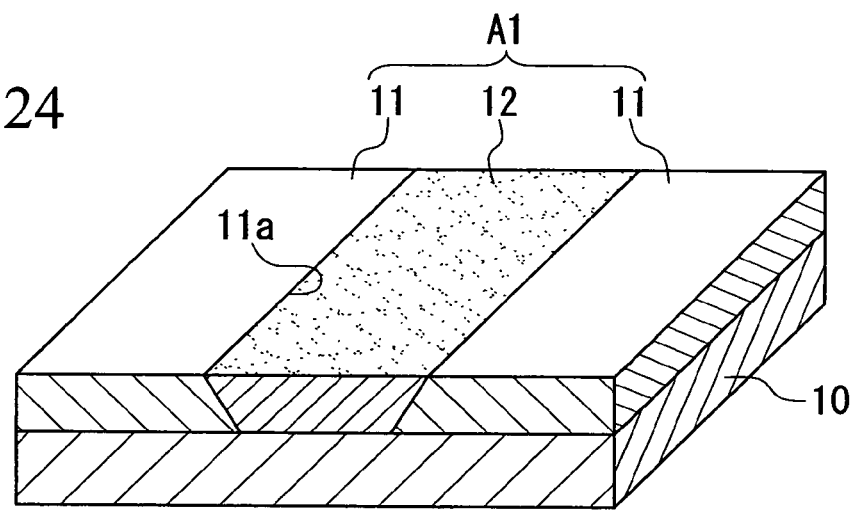
FIG. 24 is a drawing showing the continuation of the same fabricating method, and is a partial perspective drawing showing the step in which the gate scanning line electrode is formed.

As shown in FIG. 23, in the first bank formation step (bank formation step), first banks 11 for providing the groove 11a that is 1/10 to 1/20 the pitch of one pixel are formed by photolithography. Transparency and a liquid repellency must be provided to the banks 14 after formation, and thus a high molecular material such as an acryl resin, a polyimide resin, a olefin resin, a melanin resin or the like can be suitably used as this material.

In order to provide a liquid repellency to the banks 11 after formation, it is necessary to carry out $CF_4$ plasma treatment (plasma treatment in which a gas incorporating a fluoride component is used), but instead, the material of the banks 11 itself can include a liquid repelling material (a fluorine group or the like) in advance. In this case, the $CF_4$ plasma treatment can be omitted.

As described above, the contact angle of the liquid repelling banks 11 with respect to the ejected ink is preferably guaranteed to be 40° or greater. Specifically, as a result of experimental confirmation by the inventors, a after treatment contact angle of 66.2° (10° or less when untreated) with respect to, for example, an organic silver compound (a diethylene glycol dimethyl ether solvent) can be guaranteed when using an organic material as the material for the banks 11, and an angle of 49.0° (10° or less when untreated) can be guaranteed when an inorganic material is used. Note that these contact angles are obtained under treatment conditions in which the plasma power is 550 W and the tetrafluoromethane gas is supplied at 0.11 ml/min. In addition, as a result of experimental confirmation by the inventors, a contact angle of 104° (10° or less when untreated) after treatment with respect to pure water can be guaranteed when using an organic material as the material for the banks 11, and a contact angle of 96.3° (10° or less when untreated) can be guaranteed when an inorganic material is used. Note that these contact angles are obtained under the same treatment conditions as described above.

In the gate scanning line electrode formation step (first conductive pattern formation step) that follows the first bank formation step described above, as shown in FIG. 24, the gate scanning line electrode 12 is formed by ejecting a liquid that includes a conductive material by using an ink jet such that the groove 11a, which is the formation region defined by the banks 11, is filled. Ag, Al, Au, Cu, palladium, Ni, W—Si, conducting polymers and the like can be appropriately used as the conducting material here. The gate scanning line electrode 12 formed in this manner imparts in advance a sufficient liquid repellency to the banks 11, and thus it becomes possible to form a fine wiring pattern that does not project from the groove 11a.

By the steps described above, a first conductive layer A1 that provides a flat surface consisting of banks 11 and a gate scanning line electrode 12 is formed on the substrate 10.

Note that in order to obtain an advantageous ejection result in the groove 11a in the banks 11, as shown in FIG. 23, preferably a forward-taper (a tapered profile that opens toward the ejection source) is used as the profile of this groove 11a. Thereby, it becomes possible for the ejected droplet to fill the grooves down to the bottom.

Figure 25:
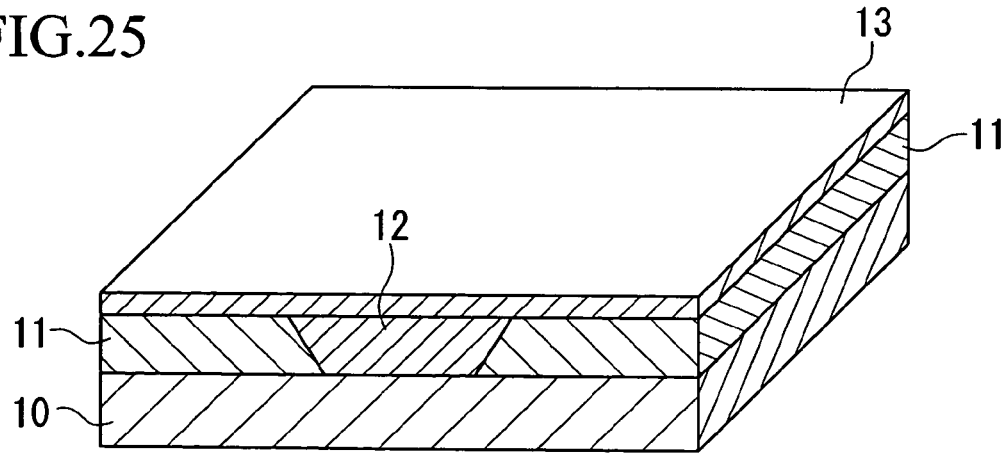
FIG. 25 is a drawing showing the continuation of the same fabricating method, and is a partial perspective drawing showing the step in which the first insulating layer is formed.
Figure 26:
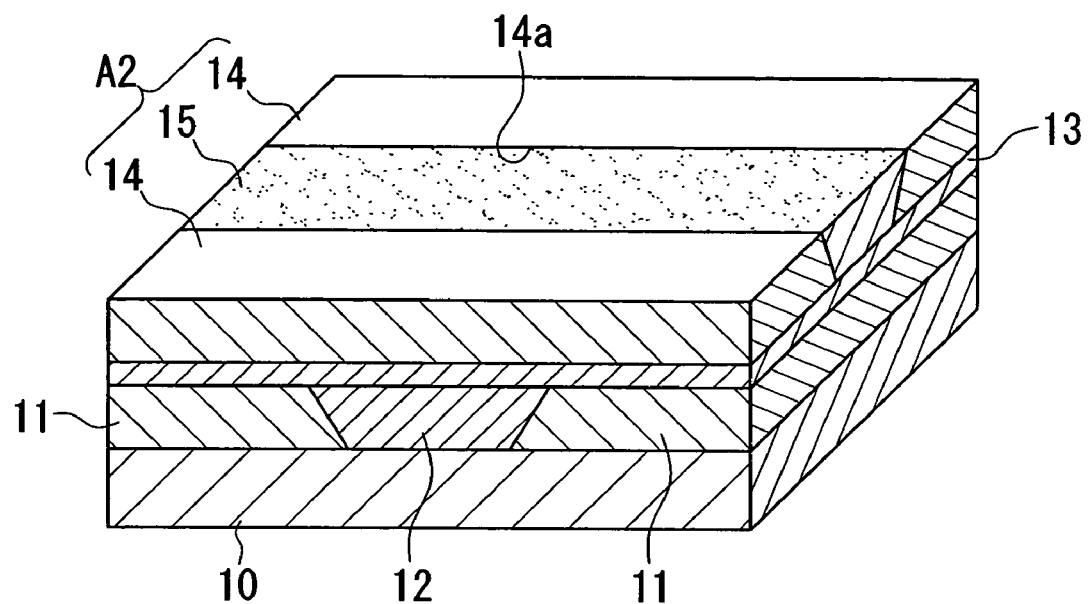
FIG. 26 is a drawing showing the continuation of the same fabricating method, and is a partial perspective drawing showing the step in which the second banks and source electrode are formed.
Figure 27:
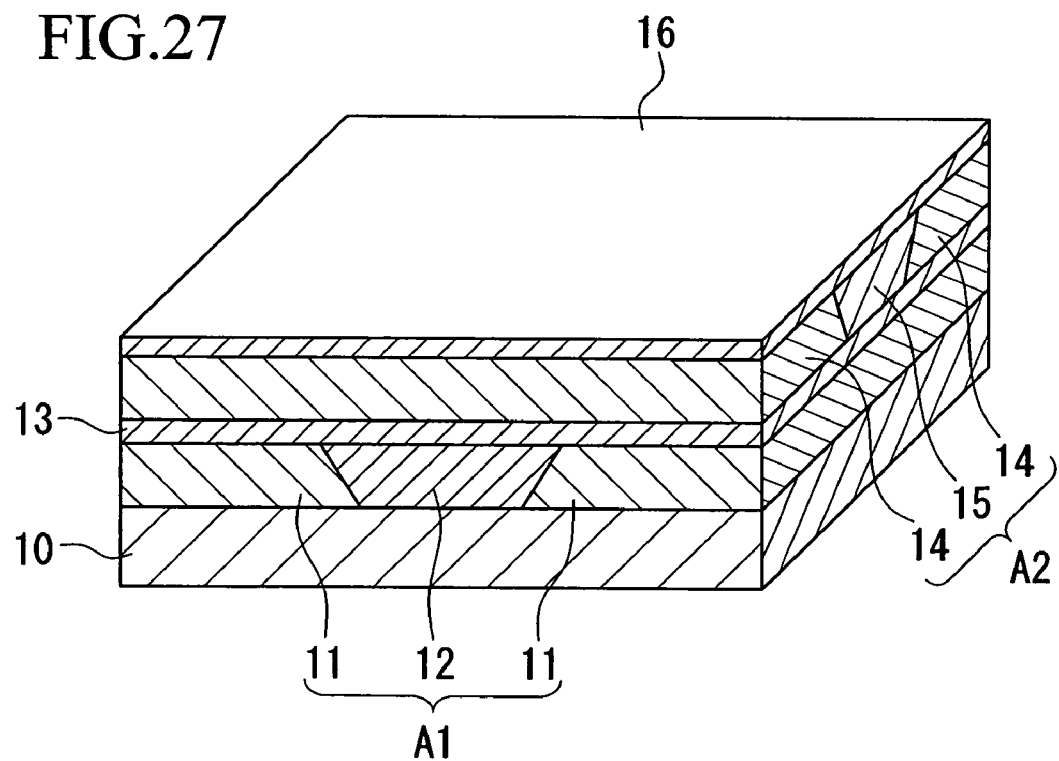
FIG. 27 is a drawing showing the continuation of the same fabricating method, and is a partial perspective drawing showing the step in which the second insulating layer is formed.

As shown in FIG. 25, in the first insulating layer formation step that follows the gate scanning electrode formation step described above, the gate scanning line insulating film (first insulating layer) is formed so as to cover the upper surface of the banks 11 and the gate scanning line electrode 12. $SiO_2$, $SiN_x$, BPSG, NSG and the like can be used as material for the gate scanning line insulating film 13.

Note that in the case in which $SiN_x$ is formed by a CVD method, a thermal history of 300° C. to 350° C. is necessary, but by using an inorganic material in the banks, it is possible to avoid problems related to transparency and heat resistance.

The gate scanning line insulating film 13 formed in this manner is formed on the flat first conductive layer A1, and thus a flat upper surface can be provided.

In the second bank formation step (bank formation step) that follows the first insulating layer formation step described above, as shown in FIG. 26, the second banks 14 are formed by lithography. These banks are for providing a groove 14a that is 1/20 to 1/10 the pitch of one pixel and intersects the substrate groove 11a. Transparency and a liquid repellency must be provided to the banks 14 after formation, and thus a high molecular material such as an acryl resin, a polyimide resin, a olefin resin, a melanin resin or the like can be suitably used as this material.

In order to provide a liquid repellency to the banks 14 after formation, it is necessary to carry out $CF_4$ plasma treatment (plasma treatment in which a gas incorporating a fluoride component is used), but instead, the material of the banks 14 itself can include a liquid repelling material (a fluorine group or the like) in advance. In this case, the $CF_4$ plasma treatment can be omitted.

As described above, the contact angle of the liquid repelling banks 11 with respect to the ejected ink is preferably guaranteed to be 40° or greater.

In the source electrode formation step (second conductive pattern formation step) that follows the second bank formation step described above, as shown in the same FIG. 26, a droplet that includes a conducting material is ejected by an ink jet so as to fill the groove 14a, which is the formation region defined by the banks 14. Thereby, a source electrode 15 is formed that intersects the gate scanning line electrode 12. Ag, Al, Au, C, palladium, Ni, W—Si, a conductive polymer or the like can be suitably used here as the conductive material. Because a sufficient liquid repellency to the banks 14 in advance, it is possible for the source electrode 15 to form a fine wiring pattern that does not protrude from the groove 14a.

By the steps described above, a second conductive layer A2 providing a flat surface consisting of the banks 14 and the source electrode 15 is formed on the substrate 10.

In the second insulating layer formation step that follows the source electrode formation step described above, as shown in FIG. 27, a source line insulating film (second insulating layer) 16 is formed so as to cover the upper surface of the banks 14 and the source electrode 15. $SiO_2$, $SiN_x$, BPSC, NSG or the like can be used as the material for this source line insulating film 16.

The source line insulation film 16 formed in this manner is formed on the flat second conductive layer A2, and thus a flat upper surface can be provided.

Figure 28:
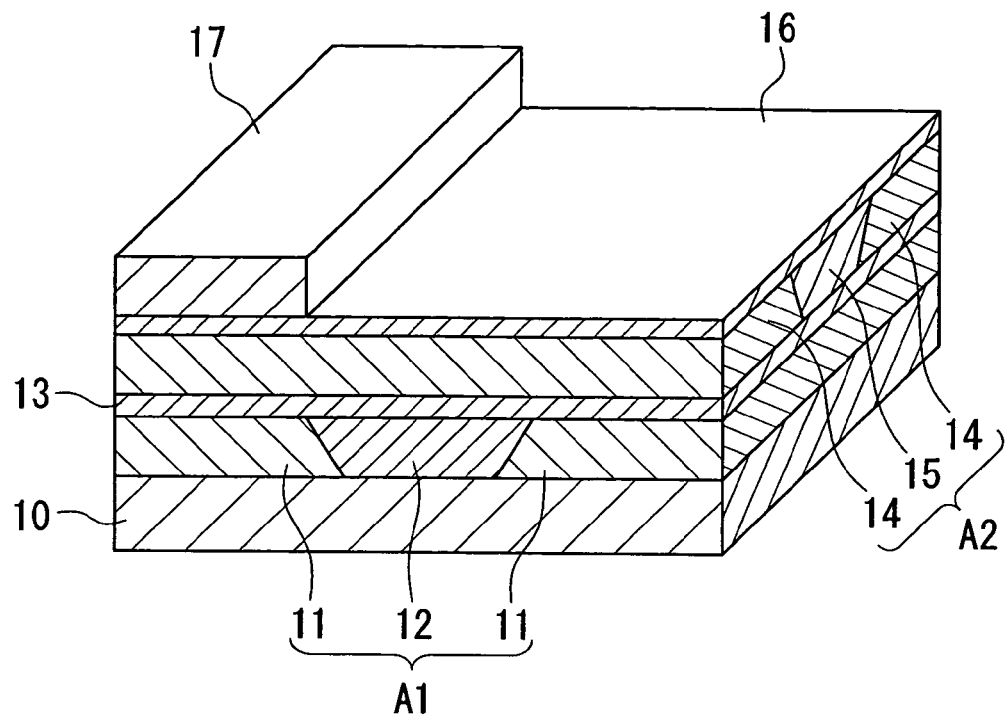
FIG. 28 is a drawing showing the continuation of the same fabricating method, and is a partial perspective drawing showing the step in which the third banks are formed.

In the third bank formation step following the second insulating film formation step, as shown in FIG. 28, except for the patterning region for the pixel electrode (ITO), a bank 17 is formed by photolithography on the upper surface of the source line insulating film 16. A high molecular material such as an acryl resin, a polyimide resin, an olefin resin, a melanin resin or the like can be appropriately used as the material for the bank 17.

Figure 29:
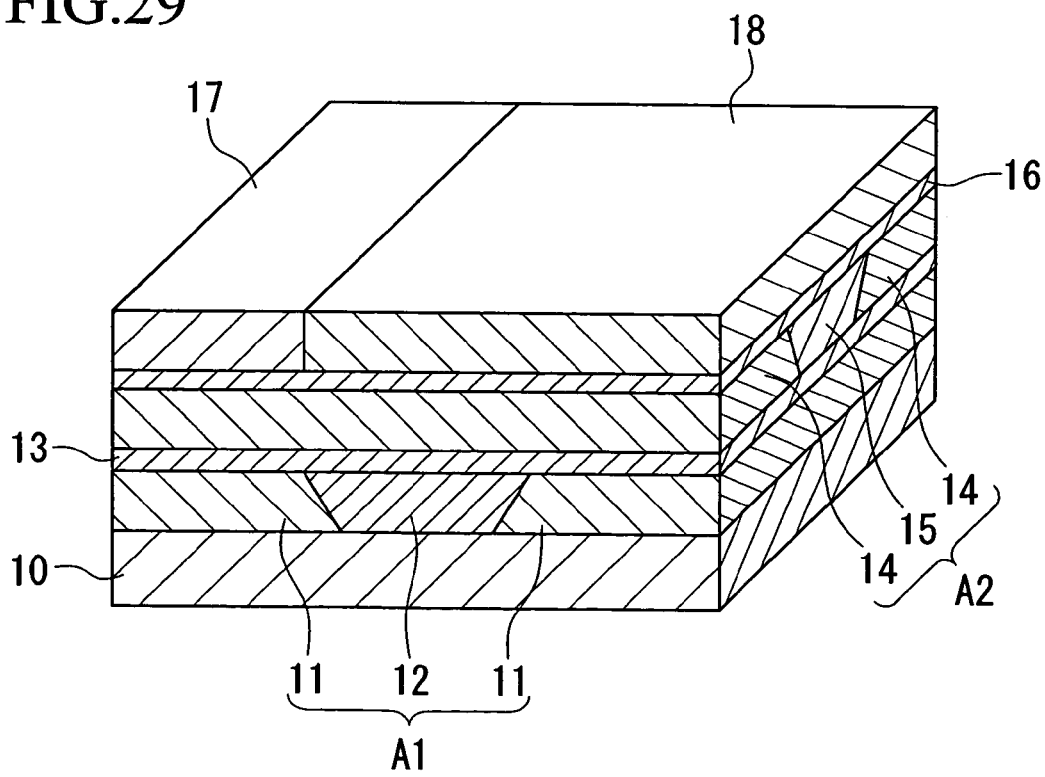
FIG. 29 is a drawing showing the continuation of the same fabricating method, and is a partial perspective drawing showing the step in which the pixel electrode is formed.
Figure 30:
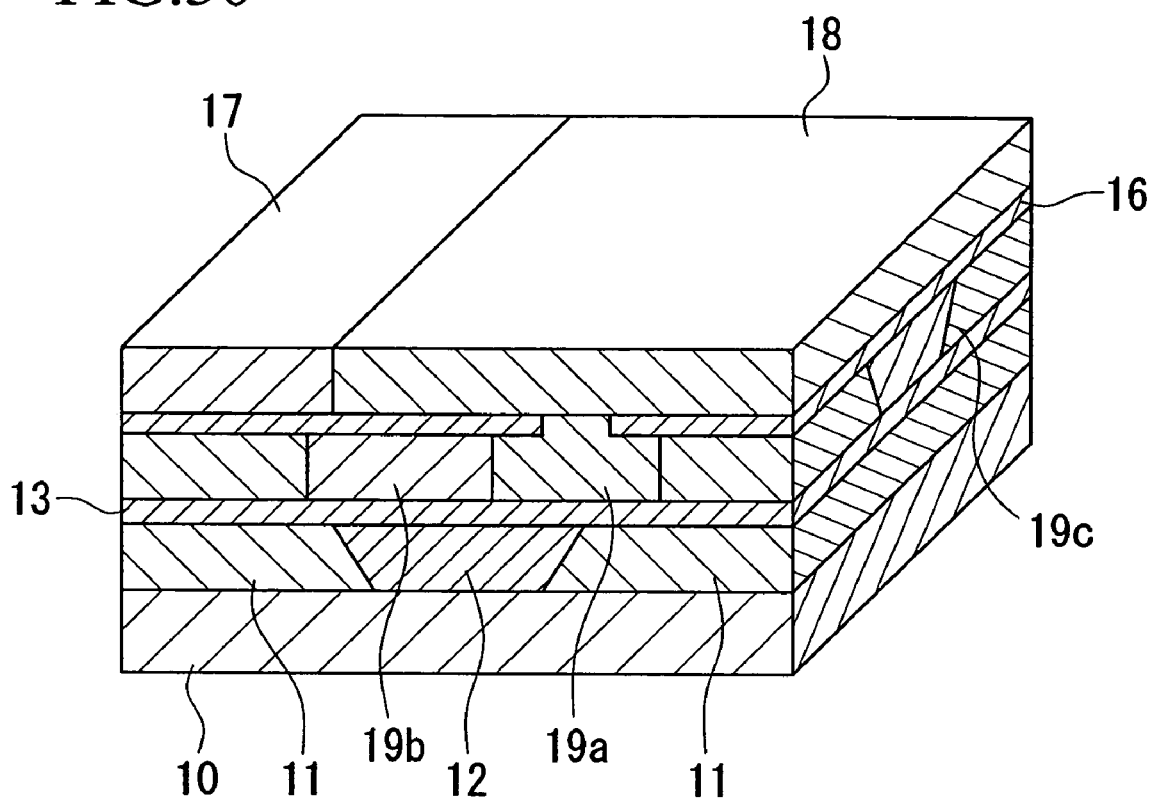
FIG. 30 is a partial perspective drawing showing an α-Si TFT device, which is another part formed by the fabricating method.

In the pixel electrode formation step that follows the third bank formation step, as shown in FIG. 29, a droplet that is the material for the pixel electrode is ejected by an ink jet into the region defined by the bank 17, and thereby the pixel electrode 18 is formed. The pixel electrode 18 formed in this manner is formed on the flat source line insulating film 16 along with the bank 17, and thus a flat surface is provided.

Note that an α-si TFT device portion formed via each of the steps described above is shown in FIG. 30. In this figure, reference numeral 19a denotes the drain electrode and reference numeral 19b denotes the channel region (α-si).

In addition, after the pixel electrode formation step, the lower substrate is completed by carrying out baking, orientation film formation, and rubbing treatment. In addition, by forming a liquid crystal layer between the lower substrate and the upper substrate fabricated separately, the liquid crystal display is completed (not illustrated).

According to the fabricating method for the liquid crystal display of the present embodiment described above, in the case in which the gate scanning line electrode 12 and the source electrode 15, which intersect each other in a planar view, are formed by using an ink jet, the gate scanning line insulating film 13 and the source line insulating film 16 are formed with the banks 11 and 14 for forming the gate scanning line electrode 12 and the source electrode 15 remaining in place, and thus it is possible to guarantee a surface profile that has fewer irregularities than a conventional one. Thereby, the result of the rubbing treatment is uniform, and thus it becomes possible to improve the liquid crystal orientation force. Thereby, it is possible to fabricate a liquid crystal display having few distortions.

Furthermore, the formation of the gate scanning line electrode 12, the source electrode 15, and the pixel electrode 18 is carried out by using an ink jet, and thereby it is possible to eliminate unnecessary waste of the materials that occurs during the fabrication steps, and thus a reduction in the material cost becomes possible.

Fifth Embodiment

Next, as a fifth embodiment, a separate embodiment of the fabrication of the TFT in the fabricating method for a liquid crystal display explained in the second embodiment described above will be explained below with reference to FIG. 31 to FIG. 34.

Note that in these figures, essential elements identical to those in FIG. 5 through FIG. 14 shown in the second embodiment have identical reference numerals, and thus the explanation thereof is omitted.

Figure 31:
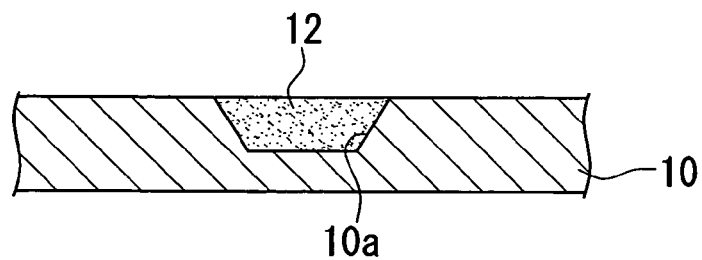
FIG. 31 is a drawing for explaining the step in which the thin film transistor is formed.

In FIG. 31, like FIG. 8, a substrate groove 10a having a grove width that is ½₀ to ⅟₁₀ the pitch of one pixel is applied by photolithography and banks are formed. Subsequently, a gate scanning line electrode 12 is formed by ejecting droplets that include a conducting material so as to fill the grove 10a. Finally, the banks are removed.

Figure 32:
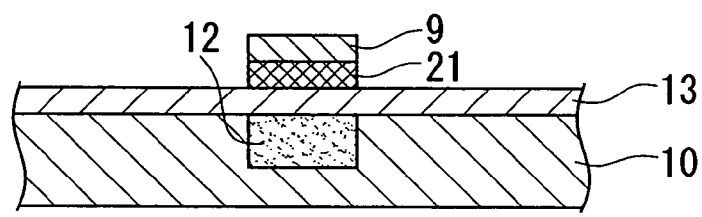
FIG. 32 is a drawing for explaining the step in which the thin film transistor is formed.
Figure 33:
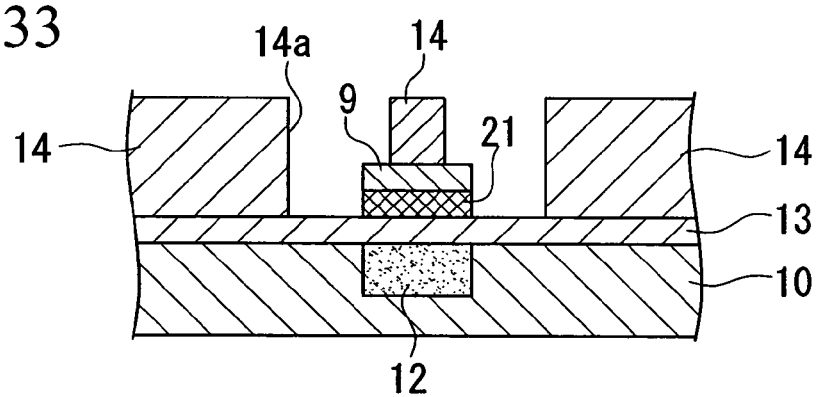
FIG. 33 is a drawing for explaining the step in which the thin film transistor is formed.

Next, as shown in FIG. 32, the continuous film formation of the gate insulating film 13, the active layer 21, and the contact layer 9 is carried out by using a plasma CVD method. By varying the source gas and the plasma conditions, the gate insulation layer 13 can be formed by a silicon nitride film, the active layer 21 can be formed by an amorphous silicon layer film, and a contact layer 9 can be formed by an $n^+$-type silicon film. In the case of formation using a CVD method, a thermal history of 300° C. to 350° C. is necessary. By using an inorganic material in the banks, it is possible to avoid problems related to transparency and thermal resistance.

In the second bank formation step (bank formation step) that follows the first insulating layer formation step described above, as shown in FIG. 33, second banks 14 are formed based on a lithographic method. These second banks and are for providing a groove 14a that is ½₀ to ⅟₁₀ the pitch of one pixel and intersects the groove 10a. Transparency and a liquid repellency must be provided to the banks 14, and thus in addition to a high molecular material such as an acryl resin, a polyimide resin, a olefin resin, a melanin resin or the like, an inorganic material such as polysilazane can be suitably used as this material.

In order to provide a liquid repellency to the banks 11 after formation, it is necessary to carry out $CF_4$ plasma treatment (plasma treatment in which a gas incorporating a fluoride component is used), but instead, the material of the banks 11 itself can include a liquid repelling material (a fluorine group or the like) in advance. In this case, the $CF_4$ plasma treatment can be omitted.

The contact angle of the liquid repelling banks 11 with respect to the ejected ink is preferably guaranteed to be 40° or greater.

Figure 34:
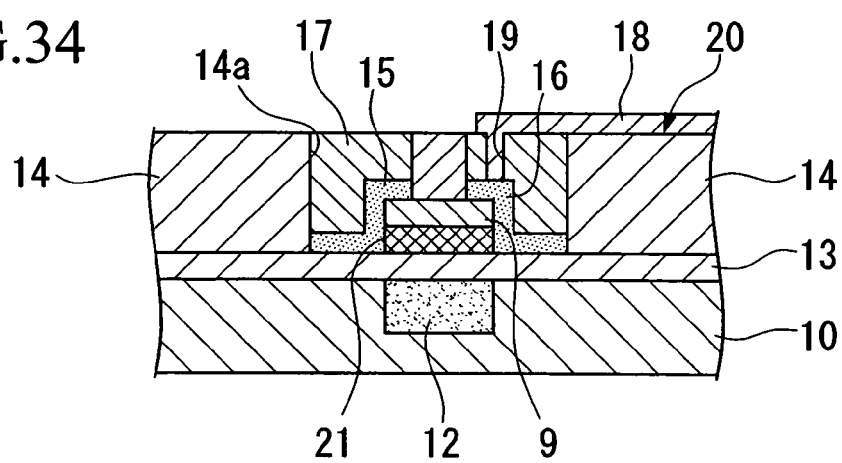
FIG. 34 is a drawing for explaining the step in which the thin film transistor is formed.

In the second layer source/drain electrode formation step (the second conductive pattern formation step) that follows the second bank formation step described above, a droplet that includes a conducting material is ejected by using an ink jet so as to fill the interior of the groove 14a, which is the formation region defined by the banks 14. Thereby, as shown in FIG. 34, the source electrode 15 and the drain electrode 16 that intersect the gate scanning line electrode 12 is formed. In addition, when the source electrode 15 and the drain electrode 16 are formed, the formation method for patterns according to the present invention can be used.

Ag, Al, Au, Cu, palladium, Ni, W—Si, conducting polymers and the like can be advantageously used as the conducting material here. The source electrode 15 and the drain electrode 16 formed in this manner impart a sufficient liquid repellency to the banks 14, and thus it is possible to form a fine wiring pattern that does not protrude from the groove 14a.

In addition, the insulating material 17 is disposed so as to fill the groove 14a in which the source electrode 15 and the drain electrode 16 are disposed. By the steps described above, a flat upper surface 20 consisting of the banks 14 and the insulating material 17 is formed on the substrate 10.

In addition, contact holes 19 are formed in the insulating material 17, and at the same time, the pixel electrode (ITO) 18 patterned on the upper surface 20 is formed, the drain electrode 16 and the pixel electrode 18 are connected via the contact hole 19, and thereby the TFT is formed.

Sixth Embodiment

Next, as a sixth embodiment, a separate embodiment of the fabrication of the TFT in the fabricating method for a liquid crystal display explained in the second embodiment described above will be explained below with reference to FIG. 35 to FIG. 38.

Note that in these figures, essential elements identical to those in FIG. 23 through FIG. 30 shown in the fourth embodiment have identical reference numerals, and thus the explanation thereof is omitted.

Figure 35:
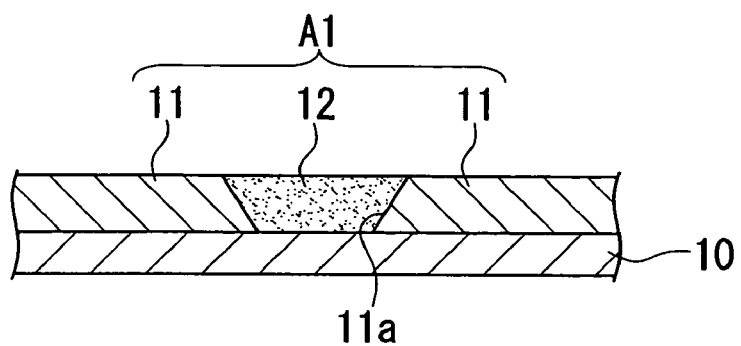
FIG. 35 is a drawing for explaining the step in which the thin film transistor is formed.

As shown in FIG. 35, first, on the upper surface of a cleaned glass substrate 10, first banks 11 are formed based on a photolithographic method. These first banks 11 are for providing grooves 11a having a grove width of 1/20 to 1/10 that of the pitch of one pixel. Transparency and a liquid repellency must be provided to the banks 11, and thus in addition to a high molecular material such as an acryl resin, a polyimide resin, a olefin resin, a melanin resin or the like, an inorganic material such as polysilazane can be suitably used as this material.

In order to provide a liquid repellency to the banks 11 after formation, it is necessary to carry out $CF_4$ plasma treatment (plasma treatment in which a gas incorporating a fluoride component is used), but instead, the material of the banks 11 itself can include a liquid repelling material (a fluorine group or the like) in advance. In this case, the $CF_4$ plasma treatment can be omitted.

In the gate scanning line electrode formation step (first conductive pattern formation step) that follows the first bank formation step described above, the gate scanning line electrode 12 is formed by ejecting a liquid that includes a conductive material by using an ink jet such that the groove 11a, which is the formation region defined by the banks 11, is filled. In addition, when forming the gate scanning line electrode 12, the formation method for patterns according to the present invention can be used.

Ag, Al, Au, Cu, palladium, Ni, W—Si, conducting polymers and the like can be appropriately used as the conducting material here. The gate scanning line electrode 12 formed in this manner imparts in advance a sufficient liquid repellency to the banks 11, and thus it becomes possible to form a fine wiring pattern that does not project from the groove 11a.

By the above steps, the first conductive layer Al consisting of silver (Ag) and providing a flat upper surface consisting of the banks 11 and the gate scanning line electrode 12 is formed on the substrate 10.

Figure 36:
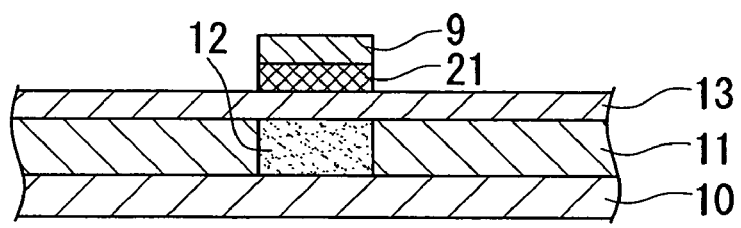
FIG. 36 is a drawing for explaining the step in which the thin film transistor is formed.

Next, as shown in FIG. 36, the continuous film formation of the gate insulating film 13, the active layer 21, and the contact layer 9 is carried out by using a plasma CVD method. By varying the source gas and the plasma conditions, the gate insulation layer 13 can be formed by a silicon nitride film, the active layer 21 can be formed by an amorphous silicon layer film, and a contact layer 9 can be formed by an $n^+$-type silicon film. In the case of formation using a CVD method, a thermal history of 300° C. to 350° C. is necessary. By using an inorganic material in the banks, it is possible to avoid problems related to transparency and thermal resistance.

Figure 37:
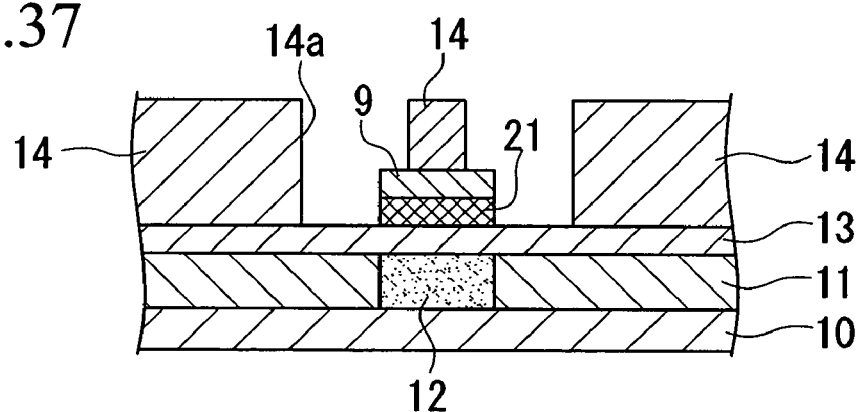
FIG. 37 is a drawing for explaining the step in which the thin film transistor is formed.
Figure 38:
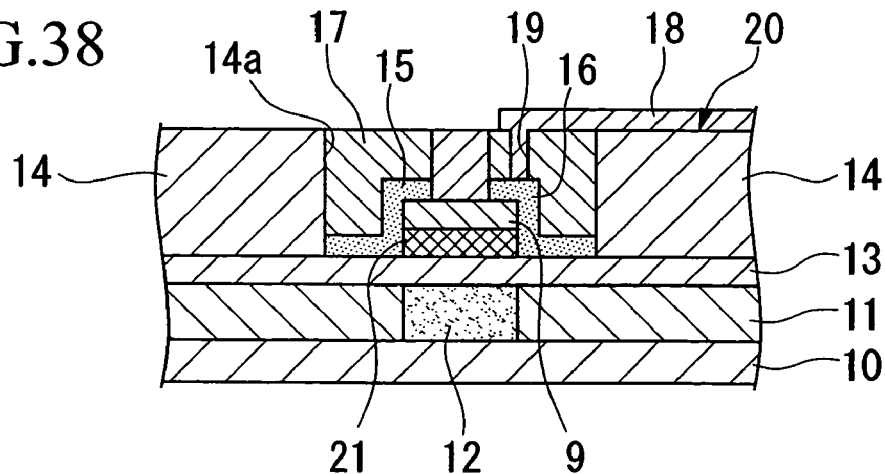
FIG. 38 is a drawing for explaining the step in which the thin film transistor is formed.

Subsequently, as shown in FIG. 37 and FIG. 38, by carrying out steps identical to those in the fifth embodiment, a TFT is formed in which the drain electrode 16 and the pixel electrode 18 are connected via the contact hole 19.

Seventh Embodiment

Figure 39:
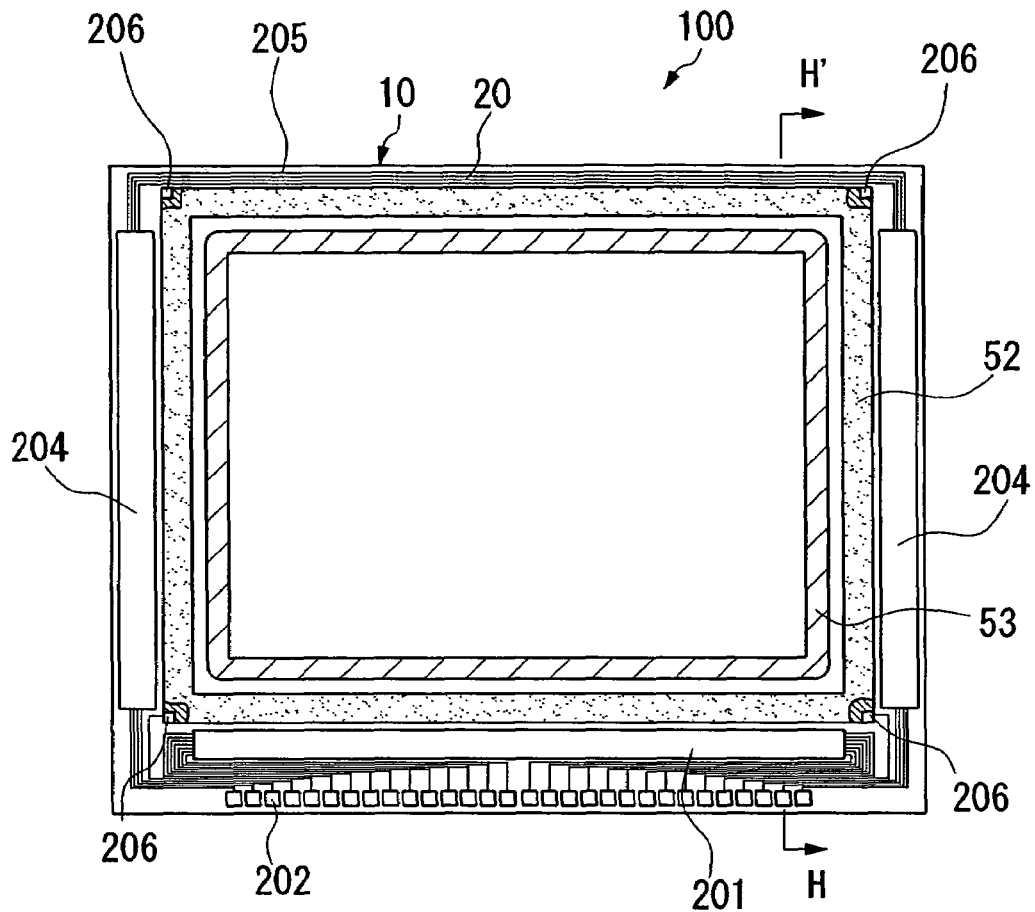
FIG. 39 is a plane drawing viewing the liquid crystal display from the side of the opposed substrate.
Figure 40:
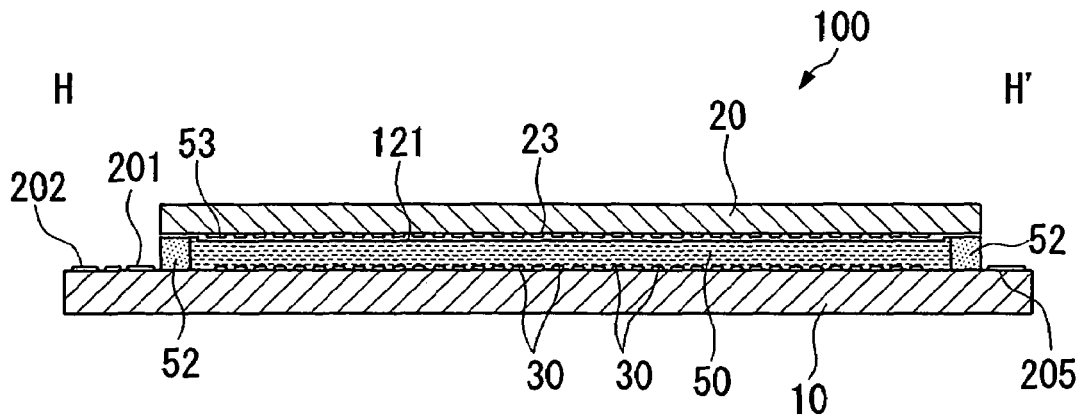
FIG. 40 is a cross-sectional drawing taken along the line H-H' in FIG. 39.
Figure 41:
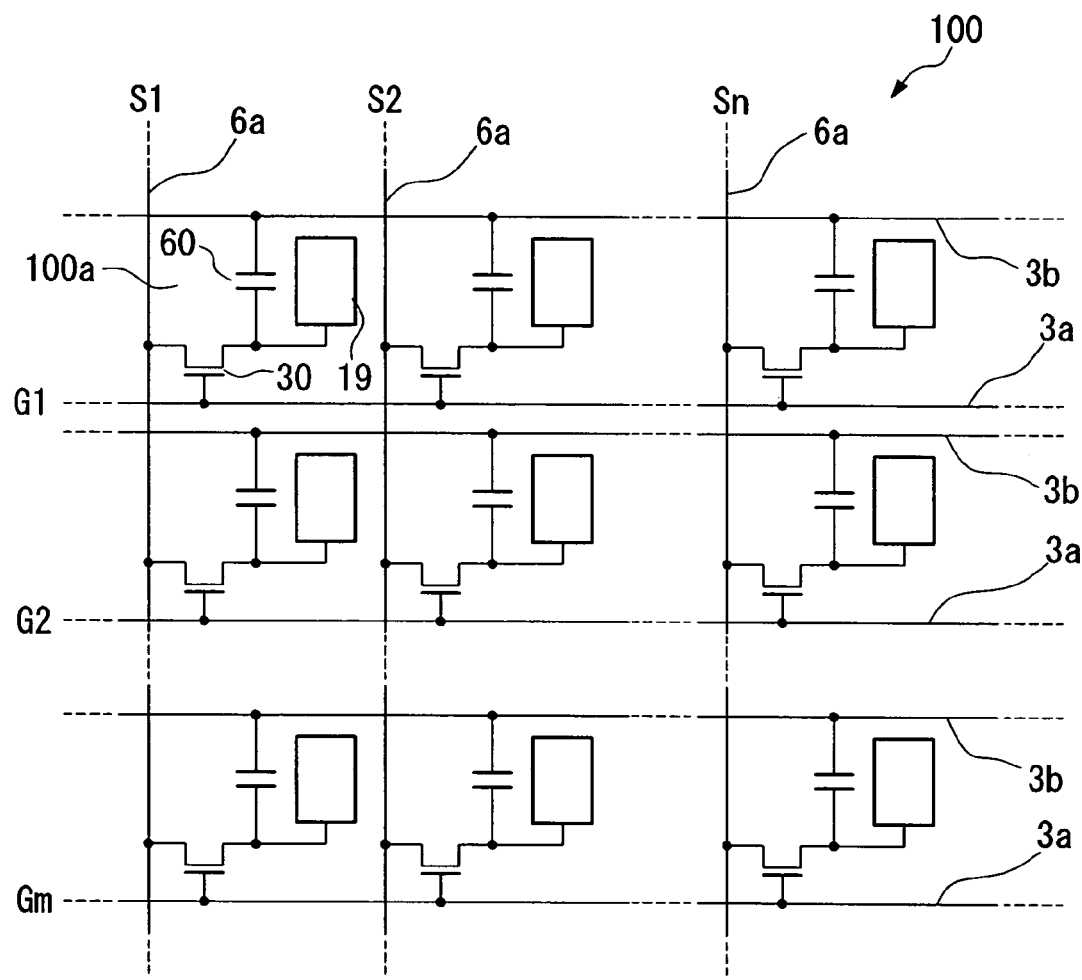
FIG. 41 is an equalizing circuit diagram for the liquid crystal display.
Figure 42:
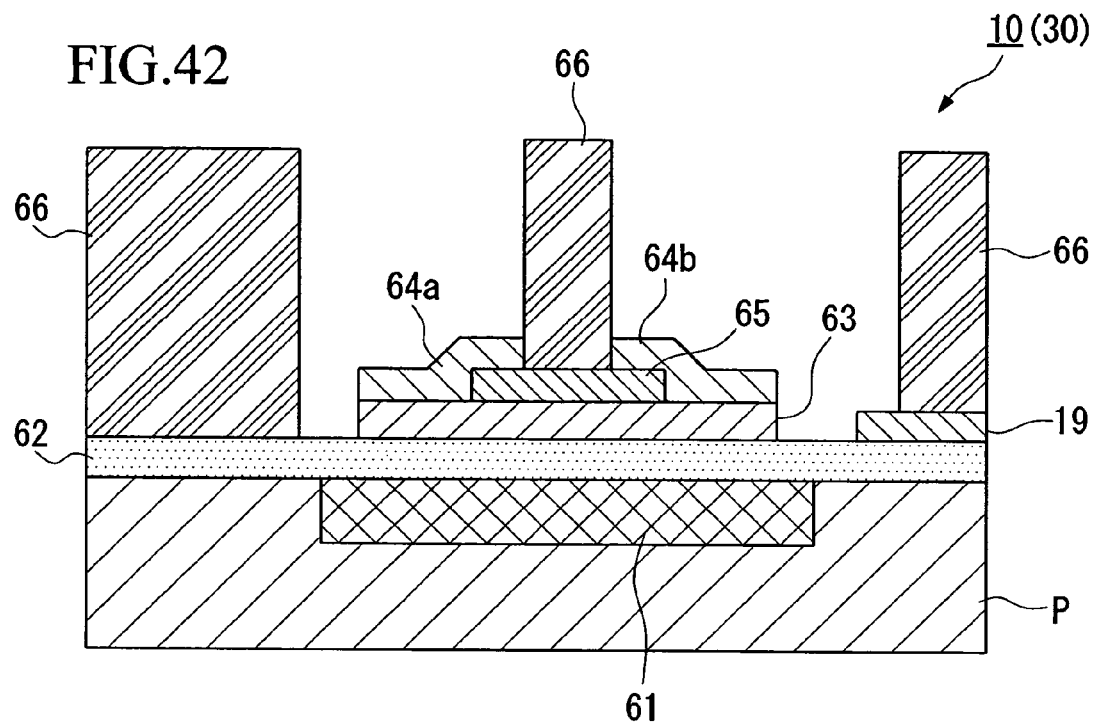
FIG. 42 is a partial enlarged cross-sectional drawing of the same liquid crystal display.

As a seventh embodiment, a liquid crystal display that is an example of an electro-optical apparatus of the present invention will be explained. FIG. 39 is a planar drawing viewed from the opposing substrate side showing each of the essential elements of the liquid crystal display according to the present invention, and FIG. 40 is a cross-sectional drawing along the line H-H' in FIG. 39. FIG. 41 is a equalizing circuit diagram of each of the elements, wiring, and the like in a plurality of pixels formed as a matrix in the image display area of the liquid crystal display, and FIG. 42 is a partial expanded cross-sectional drawing of the liquid crystal display. Note that in each of the figures used in the following explanation, in order to make each of the layers and each of the members have a size that allows recognition in the figures, the scale of each of the layers and each of the members has been changed.

In FIG. 39 and FIG. 40, in the liquid crystal display (the electro-optical apparatus) 100 of the present embodiment, the TFT array substrate 10 and the opposing substrate 20 that form pairs are fastened together by a sealing material 52, which is a photo-curing sealing material. The liquid crystal 50 is sealed and retained in the region defined by the sealing material 52. The sealing material 52 is formed into a closed frame shape that in the region in the substrate surface, does not provide a liquid crystal filler opening, and there is no sealed trace in the sealing material A circumferential parting line 53 consisting of a light blocking material is formed in the area inside the formation region of the sealing material 52. In the area outside the sealing material 52, the data line drive circuit 201 and the package terminals 202 are formed along one edge of the TFT array substrate 10, and scanning line drive circuits 204 are formed along two edges that is adjacent to the one edge. On the remaining edge of the TFT array substrate 10, a plurality of wirings 205 are provided to connection the scanning line drive circuits 204 provided on both sides of the image display area. In addition, in at least one location on the corner portion of the opposing substrate 20, an inter-substrate conducting member 206 is disposed in order to provide electrical conduction between the TFT array substrate 10 and the opposing substrate 20.

Note that instead of forming the data line drive circuit 201 and the scanning line drive circuits 204 on the TFT array substrate 10, it is possible, for example, to electrically and mechanically connect a TAB (tape automated bonding) substrate packaging the drive LSI and the peripheral portion of TFT array substrate 10 via an anisotropic conducting film. Note also that in the liquid crystal display 100, depending on the type of the liquid crystal 50 to be used, a phase difference plate or a polarized light plate are disposed at a predetermined angle, but here the illustration thereof has been omitted. Examples of such operating modes are the TN (twisted nematic) mode, C-TN method, VA format, IPS format and the like, and the normally white mode/normally black mode.

In addition, in the case in which the liquid crystal display 100 is formed for color display, in the opposing substrate 20, red (R), green (G), and blue (B) color filters are formed along with the protecting films therefore in the area opposed to each of the pixel electrodes (described below) of the TFT array substrate 10.

In the image display area of the liquid crystal display 100 having the this type of structure, as shown in FIG. 41, a plurality of pixels 100a are formed as a matrix, and in addition, in each of these pixels 100a, a pixel switching TFT (switching element) 30 is formed, and data lines 6a that supply pixel signals S1, S1, . . . , Sn are electrically connected to the source of the TFT 30. The pixel signals S1, S2, . . . , Sn that write to the data lines 6a can be supplied in this order to the lines in sequence, or, for the plurality of adjacent data lines 6a together, can be supplied to each group. In addition, at the gates of the TFT 30, the scanning lines 3a are electrically connected, and at a predetermined timing, the scanning signals G1, G2, . . . , Gm are applied as pulses to the scanning lines 3a in this order to the lines in sequence.

The pixel electrode 19 is electrically connected to the drain of the TFT 30, and by turning ON the TFT 30 that is a switching element only for a constant interval, the pixel signals S1, S2, . . . , Sn supplied from the data lines 6a are written at a predetermined timing into each of the pixels. In this manner, pixel signals S1, S2, . . . , Sn written to the liquid crystals via the pixel electrode 19 at a predetermined level are maintained at a constant interval between the opposing electrodes 121 of the opposing substrate 20 shown in FIG. 6. Note that in order to prevent leakage of the maintained pixel signals S1, S2, . . . , Sn, an accumulating capacitance 60 is added parallel to the liquid crystal capacitance formed between the pixel electrode 19 and the opposing electrodes 121. For example, the voltage of the pixel electrode 19 can be held by the accumulating capacitance 60 by a time period that is hundreds of times longer than the interval that the source voltage is applied. Thereby, the charge holding characteristics are improved, and thereby it is possible to realize a liquid crystal display 100 that has a high contrast ratio.

FIG. 42 is a partial expanded cross-sectional drawing of the liquid crystal display 100 having the bottom gate TFT 30, and on the glass substrate P that forms the TFT array substrate 10, gate wiring 61 is formed substantially flush with the surface of the glass substrate P by the wiring pattern formation step in the first embodiment described above. Note that, in the present embodiment, when (forming the concave part for) forming the gate wiring 61, the gate wiring 61 is heated up to approximately 350° C. in a process that forms an amorphous silicon layer described below, and thus an inorganic bank material is used as a material that can withstand this temperature.

A semiconductor layer 63 consisting of an amorphous silicon (a-Si) layer is laminated via a gate insulating layer 62 consisting of $SiN_x$ on the gate wiring 61. A portion of the semiconductor layer 63 that opposes this gate wiring portion serves as the channel region. Junction layers 64a and 64b consisting of an $n^+$-type a-Si layer, for example, are laminated on the semiconductor layer 63 in order to obtain an ohmic junction, and an insulating etch stop film 65 consisting of $SiN_x$ is formed in order to protect the channel on the semiconductor layer 63 in the center portion of the channel region. Note that the gate insulating layer 62, the semiconductor layer 63 and the etch stop film 65 are patterned as shown in the figure by applying a resist coating after vaporization (CVD), light sensitizing/development, and photoetching.

Furthermore, by similarly forming the pixel electrode 19 consisting of the junction layers 64a and 64b, and the ITO, and carrying out photoetching, patterning is carried out as shown in the figure. In addition, it is possible to form a source line and a drain line by building up banks 66 on the pixel electrode 19, the gate insulating film 62, and the etch stop film 65, using the droplet ejection device IJ described above between these banks 66, and ejecting a droplet of a silver compound.

Figure 43:
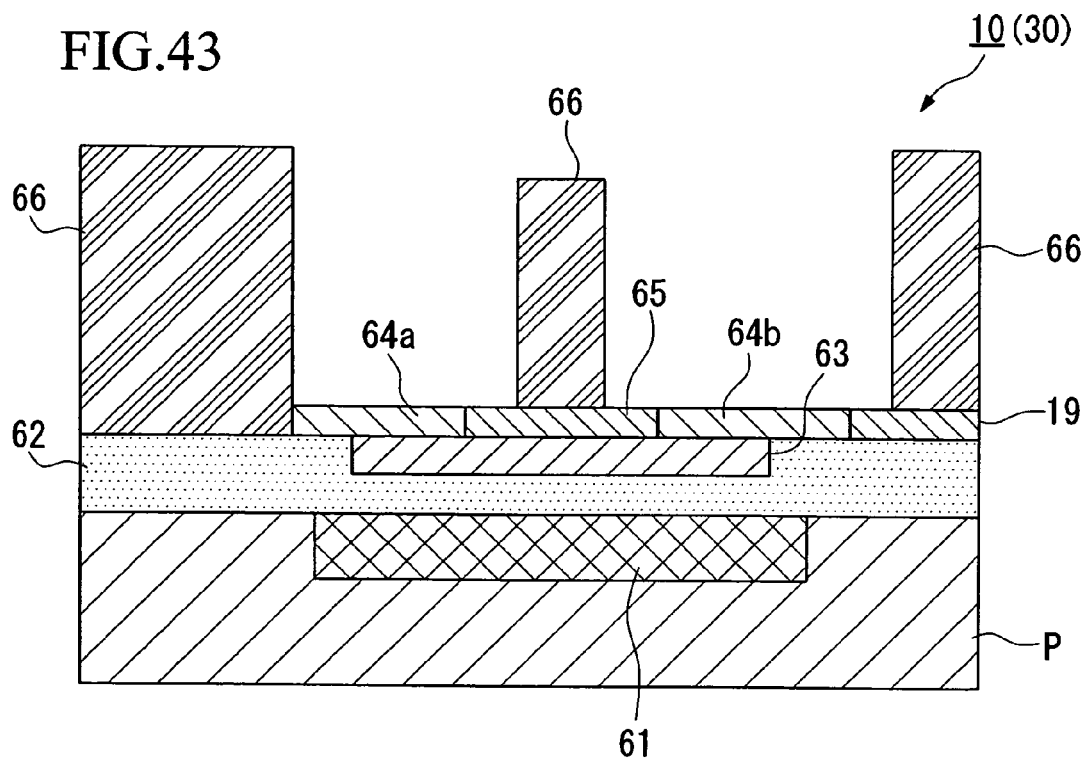
FIG. 43 is a partial enlarged cross-sectional drawing of another embodiment of the liquid crystal display.

Note that as shown in FIG. 43, a concave part is provided in the gate insulating film 62 by a pattern formation method similar to that of the gate wiring 61, the semiconductor layer 63 is formed substantially flush to the surface of the gate insulating film 62 in the concave part, and it is possible to form the junction layers 64a and 64b, the pixel electrode 19, and the etch step film 65. In this case, by making the groove bottom parts between the banks 66 flat, each of these layers, the source line, and the drain line do not curve in cross-section, and thus it is possible to make a TFT having superior flatness and high performance characteristics.

In this manner, in the present embodiment, it is possible to obtain a liquid crystal display 100 that has high performance characteristics, is flat, and can have high integration.

Eighth Embodiment

The embodiment described above was formed by using a TFT 30 as a switching element for driving the liquid crystal display 100, but this can be applied to devices other than the liquid crystal display, such as an organic EL (electro-luminescent) device. An organic EL display device has a structure in which a thin film that includes a luminescent inorganic and organic compound interposed between a negative electrode and a positive electrode, an exciton is generated by injecting and exciting electrons and positive holes into the thin film, and this exciton is an element that generates light by using a light discharge (luminescence, phosphorescence) when the exciton is recoupled. In addition, on the substrate having this TFT 30, among the luminescent members used in the organic EL display device elements, a member that presents each of the generated light colors of red, green and blue, that is, a light emitting layer formation material and a material that forms a positive hole injection/electron transport layer are used as ink, and by patterning each of these, it is possible to fabricate a spontaneous light full color EL device.

The type of organic EL device is also included within the scope of the device (electro-optical apparatus) of the present invention.

Figure 44:
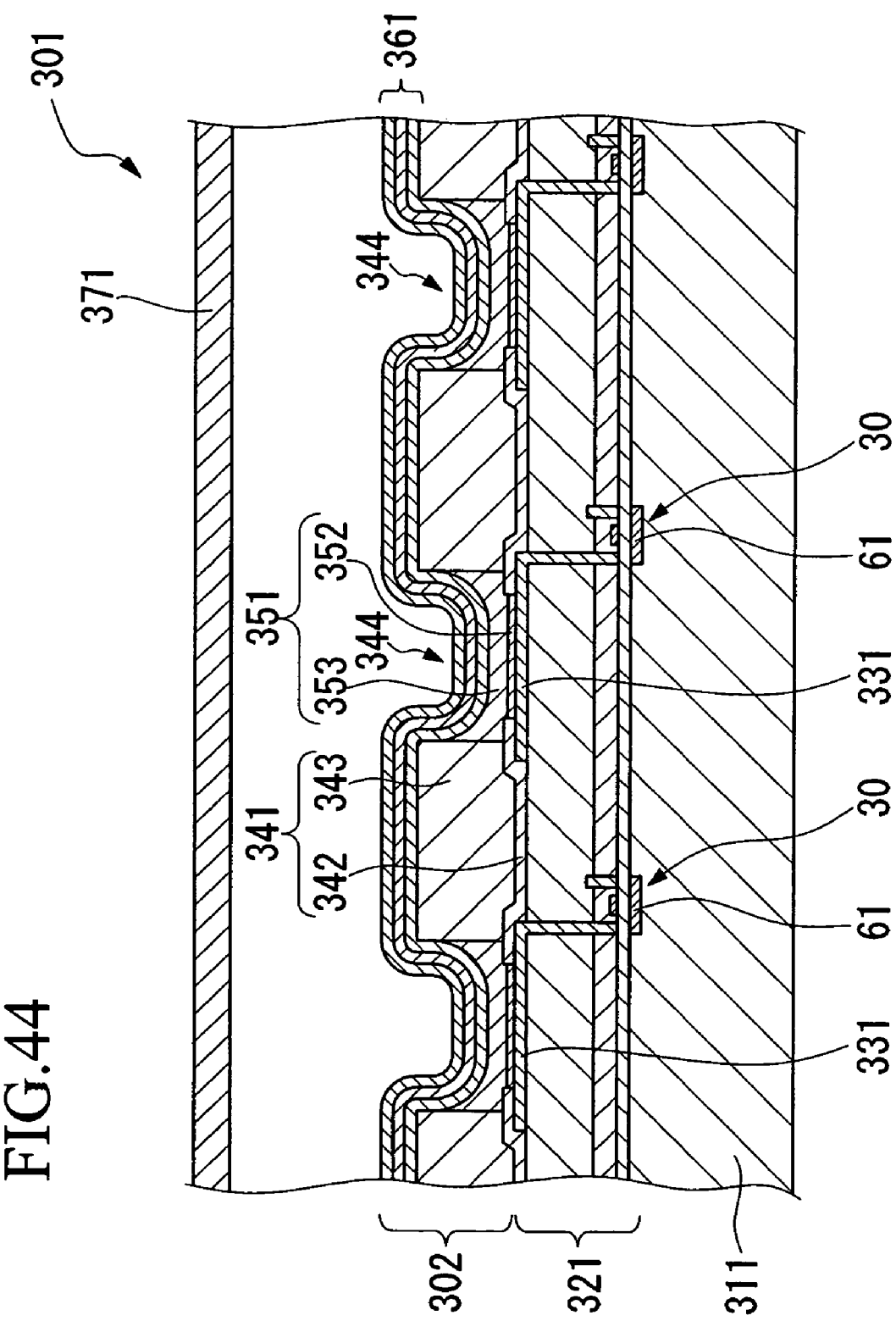
FIG. 44 is a partial enlarged cross-sectional drawing of an organic EL device.

FIG. 44 is a side cross-sectional drawing of the organic EL device, in which a part of the essential element is fabricated by the droplet ejection device IJ described above. The schematic structure of the organic EL device will be explained with reference to FIG. 44.

In FIG. 44, in the organic EL device, the wiring of a flexible substrate (not illustrated) and a drive IC (not illustrated) are connected to an organic EL element 302 formed by a substrate 311, a circuit element unit 321, a pixel electrode 331, a bank 341, a light emitting element 351, a cathode 361 (opposed electrode), and a sealing substrate 371. The circuit element unit 321 is formed by the TFT 30, which is the active element, being formed on the substrate 311 and a plurality of pixel electrodes 311 being arrayed on the circuit element unit 321. In addition, the gate wiring 61 that forms the TFT 30 is formed by a formation method for a wiring pattern in the embodiment described above.

The banks 341 are formed having a lattice structure between each of the pixel electrodes 331, and light emitting elements 351 are formed in the concave opening 344 defined by the banks 341. Note that the light emitting element 351 consist red light emitting elements, green light emitting elements, and blue light emitting elements, and thereby, the organic EL device 301 realizes full color display. The cathode 361 is formed over the entire surface of the banks 341 and the light emitting elements 351, and the sealing substrate 371 is laminated on the cathode 361.

The fabrication process for the organic EL device 301 that includes the organic EL element provides a bank formation step in which banks 341 are formed, a plasma treatment step for appropriately forming the light emitting elements 351, a light emitting element formation step in which the light emitting elements 351 are formed, an opposing electrode formation step in which the cathode 361 is formed, and a sealing step in which the sealing substrate 371 is laminated on the cathode 361.

The light emitting element formation step forms the light emitting element 351 by forming the positive hole injection layer 352 and the light emitting layer 353 in the concave opening 344, that is, on the pixel electrode 331, and provides a positive hole injection layer formation step and a light emitting layer formation step. In addition, the positive hole injection layer formation step consists of a first ejection step in which a liquid material is ejected onto each of the pixel electrodes 331 in order to form the positive hole injection layer 352 and a first drying step in order to form the positive hole injection layer 352 by drying the ejected liquid material. In addition, the light emitting layer formation step consists of a second ejection step in which a liquid material is ejected onto the positive hole injection layer 352 in order to form the light emitting layer 353 and a second drying step that forms the light emitting layer 353 by drying the ejected liquid material. Note that three types of the light emitting layer 353 are formed by materials corresponding to the three colors red, green, and blue as described above, and therefore the second ejection step consists of three steps for ejecting the three respective types of material.

In the light emitting element formation step, it is possible to use the droplet ejection device IJ described above in the first ejection step in the positive hole injection layer formation step and the second ejection step in the light emitting layer formation step.

Figure 45:
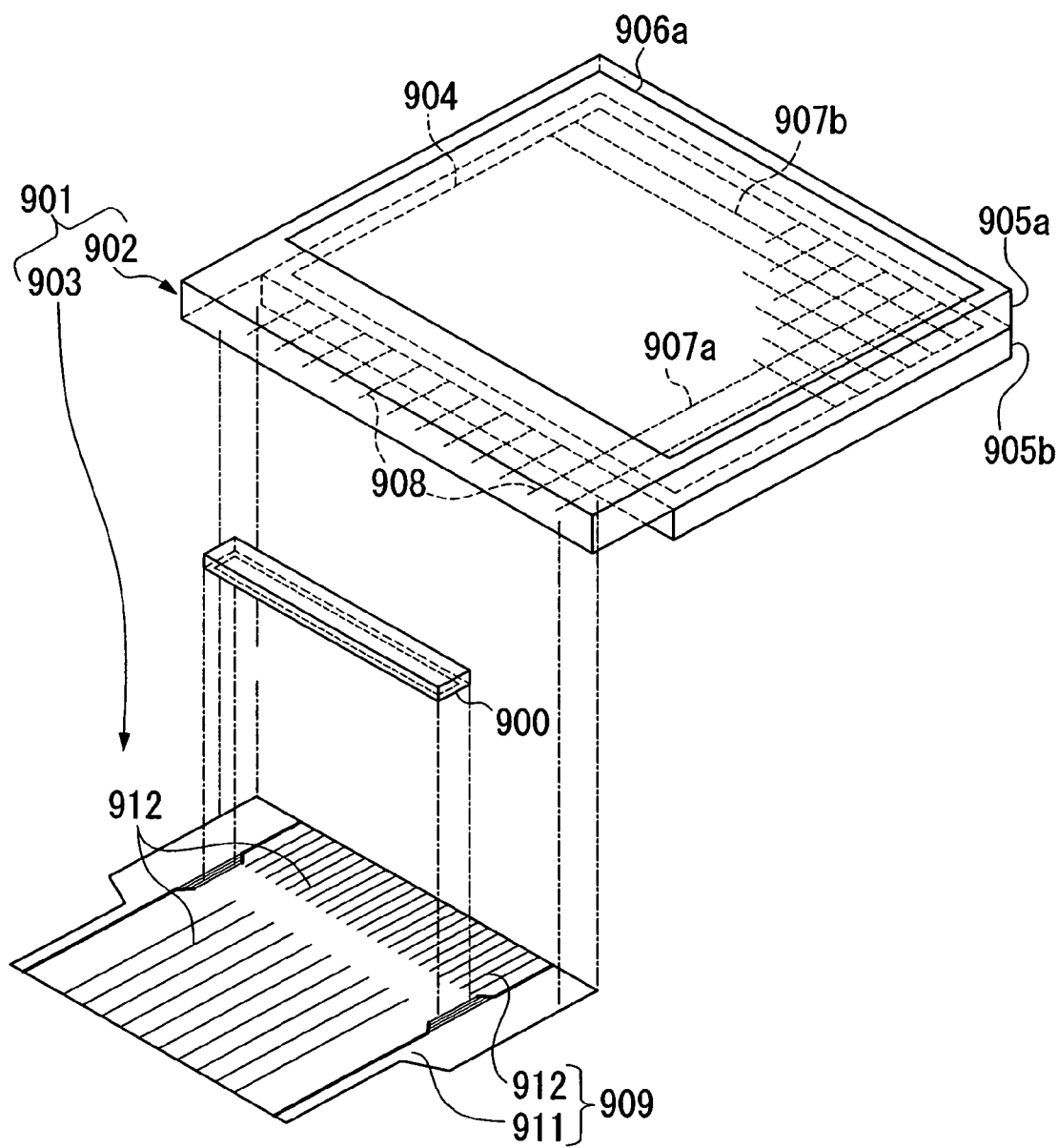
FIG. 45 is a drawing showing another embodiment of the liquid crystal display.

Ninth Embodiment FIG. 45 is a figure showing another embodiment of the liquid crystal display.

The liquid crystal display (electro-optical apparatus) 901 shown in FIG. 45 broadly provides a liquid crystal panel (electro-optical panel) 902 and a circuit substrate 903 connected to the liquid crystal panel 902. In addition, as necessary, an illuminating device such as a backlight and other accessory devices can be added to the liquid crystal panel 902.

The liquid crystal panel 902 has a pair of substrates 905a and 905b that are attached by the sealing material 904, and a liquid crystal is sealed in the gap formed between these substrates 905a and 905b, which is referred to as a cell gap. These substrates 905a and 905b are generally formed by a light transmitting material, such as glass or a synthetic resin. The polarizing plate 906a and another polarizing plate are attached on the outer surfaces substrate 905a and the substrate 905b. Note that another polarizing plate is not shown in FIG. 45.

In addition, the electrodes 907a are formed on the inner surface of the substrate 905a, and the electrodes 907b are formed on the inner surface of the substrate 905b. These electrodes 907a and 907b are formed into an appropriate pattern such as a stripe shape, a letter, number, or other pattern. In addition, these electrodes 907a and 907b are formed by a transparent material such as ITO (indium tin oxide). The substrate 905a has an overhanging part that hangs over the substrate 905b, and a plurality of terminals 908 are formed on this overhanging part. These terminals 908 are formed at the same time that the electrodes 907a are formed on the substrate 908a. Therefore, these terminals 908 are formed by, for example, ITO. These terminals 908 include ones that extend integrally from the electrodes 907a and ones that are connected to the electrodes 907b via a conducting material (not illustrated).

The semiconductor elements 900 that serve as the liquid crystal drive ICs are mounted at predetermined locations on the wiring substrate 909. Note that although not illustrated, resistors, capacitors, and other chip elements can be packaged at predetermined locations at sites outside the sites where the semiconductor elements 900 are mounted. The wiring substrate 909 is fabricated by forming a wiring pattern 912 by patterning a metal film such as Cu formed on a flexible base substrate 911 such as a polyimide.

In the present embodiment, the electrodes 907a and 907b in the liquid crystal panel 902 and the wiring pattern 912 in circuit substrate 903 are formed by A method for fabricating a device.

According to the liquid crystal display of the present embodiment, it is possible to obtain a liquid crystal display that realizes downsizing and thinning.

Note that the example described above is a passive liquid crystal panel, but the embodiment can also be used with an active matrix liquid crystal panel. Specifically, the thin film transistor (TFT) is formed on one substrate and pixel electrodes are formed for each TFT. In addition, it is possible to form the wiring (gate wiring, source wiring) electrically connected to each TFT using the ink jet technology described above. At the same time, opposing electrodes and the like are formed on the opposing substrate. It is possible to apply the present invention to such an active matrix liquid crystal panel.

Tenth Embodiment

Figure 46:
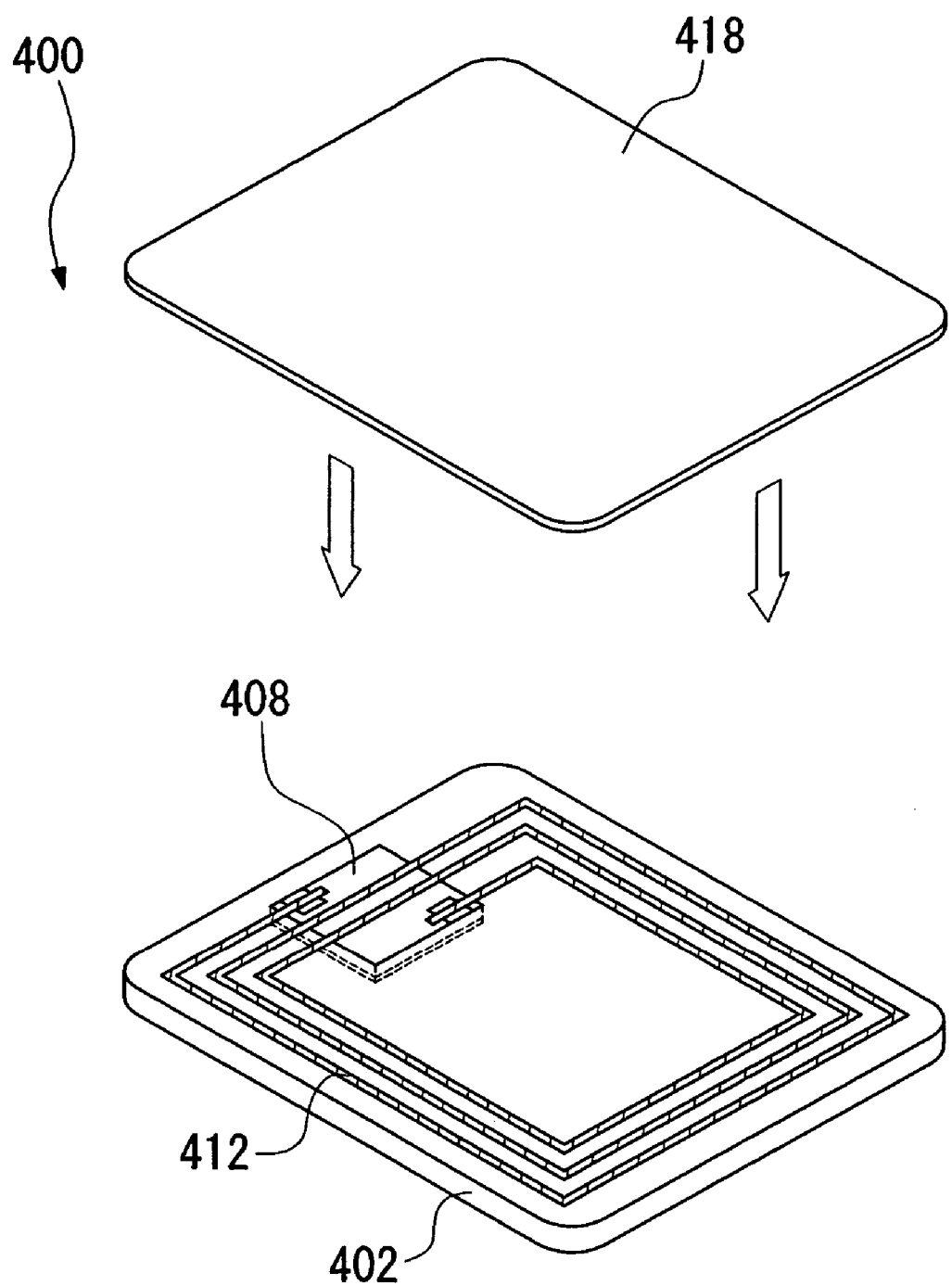
FIG. 46 is an exploded perspective drawing of the non-contact card medium.

As a tenth embodiment, the embodiment of a non-contact card medium will be explained. As shown in FIG. 46, the non-contact card medium (electrical apparatus) 400 according to the present embodiment has a semiconductor integrated circuit chip 408 and an antenna circuit 412 are built into the case in which consists of a card substrate 402 and a card cover 418. At least one of either electrical supply or data exchange is carried out by an external transmitter-receiver (not illustrated) and at least one of either electromagnetic waves or electrostatic capacitance junction.

In the present embodiment, the antenna circuit 412 described above is formed by a wiring pattern formation method according to the embodiment described above.

According to the non-contact card medium of the present embodiment, it is possible to make a non-contact card medium that is downsized and thinner.

Note that in addition to what has been described above, as a device (an electro-optical apparatus) according to the present invention, a voltage flows in parallel to a PDP (plasma display panel) and the film surface in a thin film having a small area formed on the substrate, and thereby it is possible to apply the present invention to a surface conduction electron discharge element or the like that uses the phenomenon in which electron discharge occurs.

As an eleventh embodiment, a concrete example of the electrical apparatus of the present invention will be explained.

Figure 47A:
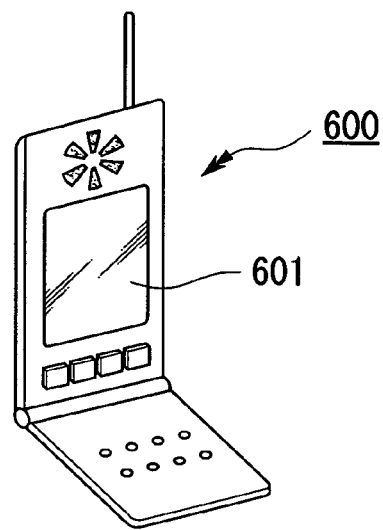
FIG. 47A to 47C are drawings showing concrete examples of the electronic device of the present invention.

FIG. 47A is a perspective drawing showing an example of a cellular telephone. In FIG. 47A, reference numeral 600 denotes a cellular telephone body, and 601 denotes that liquid crystal display unit that provides the liquid crystal display of the embodiment described above.

Figure 47B:
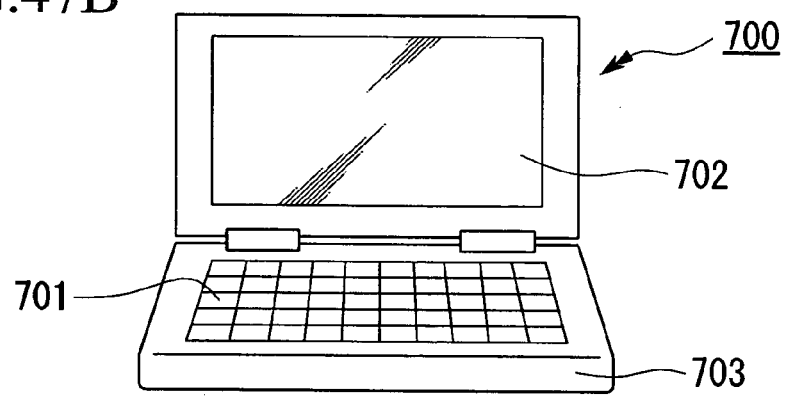

FIG. 47B is a perspective drawing showing an example of a portable information processing device such as a word processor or personal computer. Reference numeral 700 denotes an information processing device, 701 denotes an input unit such as a keyboard, and 702 denotes a liquid crystal display unit that provides the liquid crystal display of the embodiment described above.

Figure 47C:
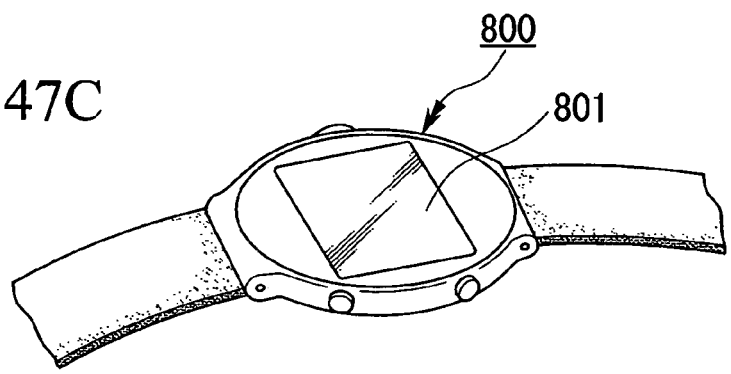
Figure 48:
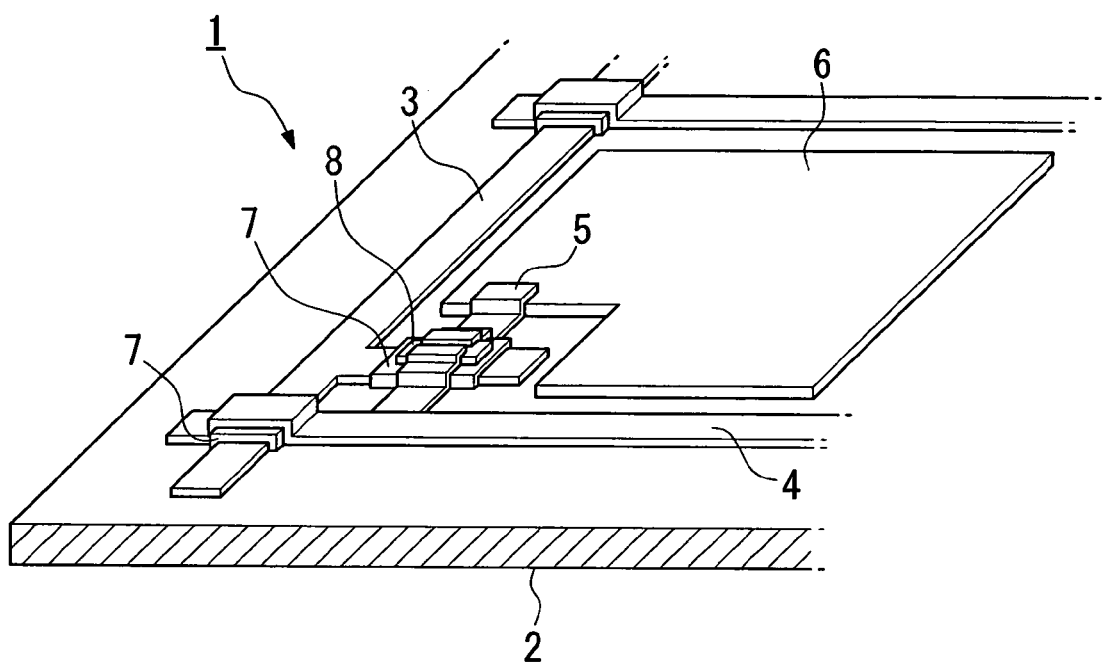
FIG. 48 is a partial enlarged perspective drawing showing one pixel on the lower substrate in a conventional liquid crystal display.

FIG. 47C is a perspective drawing showing an example of an electrical wristwatch. In FIG. 47C, reference numeral 800 denotes the watch body, and 801 denotes the liquid crystal unit that provides the liquid crystal display of the embodiment described above.

The electrical apparatuses shown in FIGS. 47A to 47C provide the liquid crystal display of the embodiments described above, and can be downsized and thinned.

Note that the electrical apparatus of the present embodiment provides a liquid crystal device, but it is possible to use an electrical apparatus that provides another electro-optical apparatus such as an organic electro-luminescent display device, a plasma display device or the like.

Above, suitable embodiments according to the present invention were explained with reference to the attached drawings. However, the present invention is not limited thereby. The shapes, combinations and the like of each of the essential elements shown in the examples described above are examples, and various changes based on the design requirements within a range that does not depart from the spirit of the present invention are possible.

For example, the embodiments described above have a structure in which banks are formed and a concave part is formed therebetween. However, this is not limiting. For example, it is possible to implement a liquid-affinity treatment on the wiring pattern by implementing a surface treatment on the substrate, implementing a liquid repelling treatment on the other parts, and forming a concave part on the part that had the liquid repelling treatment applied thereto. In addition, it is possible to form the desired wiring pattern by applying an ink that includes conductive particles in the concave part.

In addition, the embodiments described above have a structure in which a thin film pattern serves as a conducting film. However, this is not limiting. For example, it is also possible to apply this to a color filter that is used in order to colorize the display image in the liquid crystal display. This color filter can be formed by ejecting R (red), G (green), and B (blue) ink (liquid state) as a droplet using a predetermined pattern on the substrate. However, it is possible to obtain a thin color filter, that is, a thin liquid crystal display, by forming a concave part depending on a predetermined pattern on the substrate and forming a color filter by applying an ink in this concave part.

Furthermore, the embodiments described above have a form in which a function liquid consisting of a dispersing liquid in which conductive particles are dispersed in a dispersion medium. However, this is not limiting. For example, it is possible to use a material in which conduction is generated by heat (heat treatment) or optical irradiation (light irradiation treatment) after the pattern formation.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for fabricating a thin film pattern on a substrate, comprising:
    building up banks on a surface of the substrate that conform to the thin film pattern;
    forming a concave part on the substrate between the banks;
    applying a function liquid into the concave part by using a droplet ejection method to form the thin film pattern; and
    removing the banks after applying the function liquid,
    the concave part being formed by etching, and being formed so as to include a reverse-taper profile gradually widening toward a base of the concave part, and
    the thin film pattern being formed so as not to protrude from the surface of the substrate.

2. The method for fabricating a thin film pattern according to claim 1, the forming the concave part using the banks as a mask.

3. The method for fabricating a thin film pattern according to claim 1, the banks being more strongly liquid repellent than the concave part.

4. The method for fabricating a thin film pattern according to claim 1, the function liquid including conductive particles.

5. The method for fabricating a thin film pattern according to claim 1, the function liquid including a material that exhibits conductivity after heat treatment or light irradiation treatment.

6. A method for fabricating a device having a substrate, comprising:
    forming a thin film pattern on the substrate using the method for fabricating a thin film pattern according to claim 1.

7. The method for fabricating a device according to claim 6, the thin film pattern constituting a part of switching elements provided on the substrate.

8. The method for fabricating a liquid crystal display, comprising:
    forming a substrate groove in a substrate;
    forming a liquid repellent part so as to define the substrate groove;
    forming second banks that add further depth to the substrate groove during the forming of the liquid repelling part;
    forming a first conductive pattern by ejecting droplets that include a conducting material into the substrate groove from an ejection source;
    forming a first insulating layer so as to cover at least the first conductive pattern;
    removing the second banks before the forming the first insulating layer;
    forming transparent first banks on the first insulating layer that provide a thin film transistor comprising a thin film semiconductor;
    forming a second conductive pattern by ejecting droplets that include a conducting material into a formation region defined by the transparent first banks; and
    forming a second insulating layer so as to cover at least the transparent first banks and the second conductive pattern,
    the substrate groove being formed by etching, and being formed so as to include a forward-taper profile gradually widening toward the ejection source.

* * * * *

UNITED STATES PATENT AND TRADEMARK OFFICE
CERTIFICATE OF CORRECTION

PATENT NO. : 7,410,905 B2  
APPLICATION NO. : 10/854668  
DATED : August 12, 2008  
INVENTOR(S) : Toshihiro Ushiyama et al.

It is certified that error appears in the above-identified patent and that said Letters Patent is hereby corrected as shown below:

On the title page:  
Replace:  
(75) Inventors: Toshihiro Ushiyama, Chimo (JP);  
Toshimitsu Hirai, Chino (JP);  
Toshiaki Mikoshiba, Suwa (JP);  
Hiroshi Kiguchi, Suwa (JP);  
Hironori Hasei, Okaya (JP)

With:  
(75) Inventors: Toshihiro Ushiyama, Chino (JP);  
Toshimitsu Hirai, Chino (JP);  
Toshiaki Mikoshiba, Suwa (JP);  
Hiroshi Kiguchi, Suwa (JP);  
Hironori Hasei, Okaya (JP)

Signed and Sealed this

Sixteenth Day of December, 2008

JON W. DUDAS  
*Director of the United States Patent and Trademark Office*